(12) United States Patent
Hara et al.

(10) Patent No.: US 7,837,305 B2
(45) Date of Patent: Nov. 23, 2010

(54) PIEZOELECTRIC ELEMENT, INK JET HEAD, AND INK JET RECORDING DEVICE

(75) Inventors: Shintarou Hara, Fukuoka (JP); Osamu Watanabe, Kumamoto (JP); Kazumi Sadamatsu, Kumamoto (JP); Hideaki Horio, Fukuoka (JP); Eiji Fujii, Osaka (JP)

(73) Assignee: Panasonic Corporation, Osaka (JP)

( * ) Notice: Subject to any disclaimer, the term of this patent is extended or adjusted under 35 U.S.C. 154(b) by 453 days.

(21) Appl. No.: 12/021,373

(22) Filed: Jan. 29, 2008

(65) Prior Publication Data
US 2008/0259133 A1 Oct. 23, 2008

(30) Foreign Application Priority Data

Jan. 30, 2007 (JP) ............................ P2007-018911
Feb. 26, 2007 (JP) ............................ P2007-045076

(51) Int. Cl.
*B41J 2/045* (2006.01)
(52) U.S. Cl. ........................................... 347/70
(58) Field of Classification Search .................. 347/70, 347/68–69, 71–72; 310/311, 324; 400/124.14, 400/124.16
See application file for complete search history.

(56) References Cited

U.S. PATENT DOCUMENTS

| | | | |
|---|---|---|---|
| 6,109,736 A | 8/2000 | Miyata et al. | |
| 6,113,225 A | 9/2000 | Miyata et al. | |
| 6,315,400 B1 | 11/2001 | Sakai et al. | |
| 6,471,342 B1 | 10/2002 | Horio et al. | |
| 2003/0020787 A1 | 1/2003 | Nakamura et al. | |
| 2005/0001868 A1 | 1/2005 | Matsuba et al. | |
| 2005/0001877 A1 | 1/2005 | Chikanawa et al. | |
| 2005/0162047 A1 | 7/2005 | Torii et al. | |

(Continued)

FOREIGN PATENT DOCUMENTS

EP 0855273 7/1998

(Continued)

OTHER PUBLICATIONS

English language Abstract of JP 2001-284671, dated Oct. 12, 2001.

(Continued)

*Primary Examiner*—K. Feggins
(74) *Attorney, Agent, or Firm*—Greenblum & Bernstein, P.L.C.

(57) ABSTRACT

A piezoelectric element includes a pressure chamber member that has an opening communicating with a nozzle, a vibrating plate that is disposed on the pressure chamber member so as to cover the opening, a lower electrode that is disposed on the vibrating plate, a piezoelectric body that is disposed on the lower electrode, an upper electrode that is disposed on the piezoelectric body and in a region opposed to the opening, and a lead electrode that is disposed on the piezoelectric body, that extends from the upper electrode, and that has a width smaller than that of the upper electrode. The piezoelectric body includes a groove portion that is disposed in a predetermined region along an edge portion of the opening and an inactive region (piezoelectric inactive region) that is a region other than the groove portion, that is disposed along the edge portion of the opening, and that does not substantially serve as a piezoelectric element. The lead electrode is disposed in the piezoelectric inactive region.

12 Claims, 26 Drawing Sheets

U.S. PATENT DOCUMENTS

| | | |
|---|---|---|
| 2005/0243143 A1 | 11/2005 | Nakamura et al. |
| 2005/0248624 A1 | 11/2005 | Nakamura et al. |
| 2005/0259133 A1 | 11/2005 | Nakamura et al. |
| 2005/0259134 A1 | 11/2005 | Nakamura et al. |
| 2005/0264614 A1 | 12/2005 | Nakamura et al. |
| 2006/0044359 A1 | 3/2006 | Sugahara |
| 2008/0024563 A1 | 1/2008 | Matsui et al. |

FOREIGN PATENT DOCUMENTS

| | | |
|---|---|---|
| EP | 0943437 | 9/1999 |
| JP | 4-349675 | 12/1992 |
| JP | 5-286131 | 11/1993 |
| JP | 10-242539 | 9/1998 |
| JP | 10-305578 | 11/1998 |
| JP | 2000-43259 | 2/2000 |
| JP | 2000-79683 | 3/2000 |
| JP | 2001-179963 | 7/2001 |
| JP | 2001-284671 | 10/2001 |
| JP | 2001-332041 | 11/2001 |
| JP | 2003-154646 | 5/2003 |
| JP | 2004-322605 | 11/2004 |
| JP | 2005-210887 | 8/2005 |
| JP | 2005-244174 | 9/2005 |
| WO | 01/62499 | 8/2001 |

OTHER PUBLICATIONS

English language Abstract of JP 5-286131, dated Nov. 2, 1993.
English language Abstract of JP 2005-210887, dated Aug. 4, 2005.
English language Abstract of JP 4-349675, dated Dec. 4, 1992.
English language Abstract of JP 10-242539, dated Sep. 1998.
English language Abstract of JP 2000-43259, dated Feb. 15, 2000.
English language Abstract of JP 2001-179963, dated Jul. 3, 2001.
English language Abstract of JP 2001-332041, dated Nov. 30, 2001.
English language Abstract of JP 2003-154646, dated May 27, 2003.

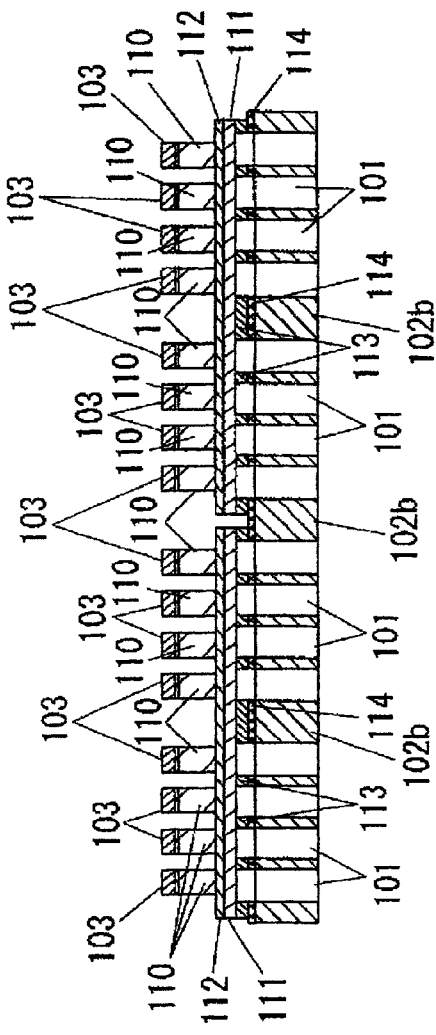
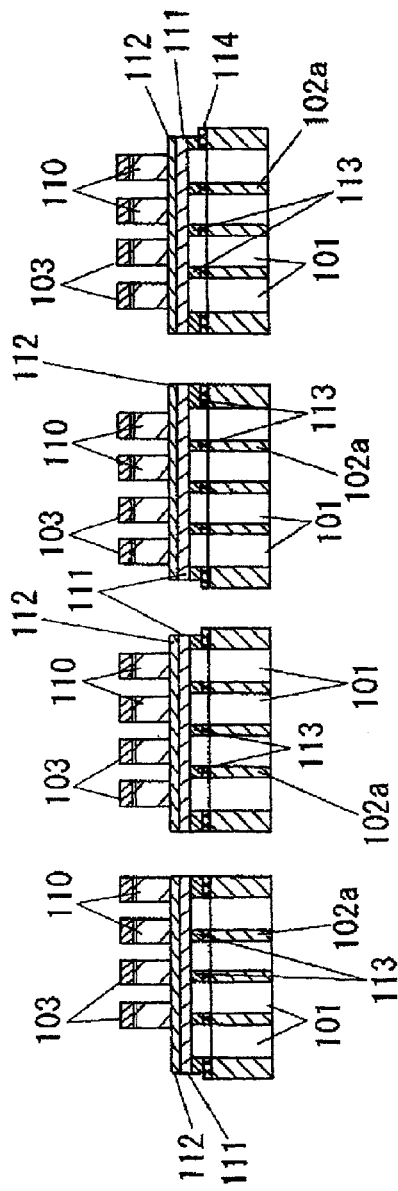
FIG. 17(a)
FIG. 17(b)

PIEZOELECTRIC ELEMENT, INK JET HEAD, AND INK JET RECORDING DEVICE

BACKGROUND

1. Field of the Invention

The present invention relates to a piezoelectric element used in a piezoelectric actuator such as a piezoelectric vibrator and a liquid ejecting device, a semiconductor recording device, and a pyroelectric infrared detecting device, an ink jet head using the piezoelectric element, and an ink jet recording device having the ink jet head.

2. Description of the Related Art

In a piezoelectric element, generally, a layered piezoelectric body (such as lead zirconate titanate (PZT)) is disposed between two electrodes (referred to as lower electrode and upper electrode in the following description). The piezoelectric body serves to convert mechanical energy into electrical energy or to convert electrical energy into mechanical energy. The piezoelectric element with such a function is used for various devices.

Piezoelectric ceramics such as lead zirconate titanate (PZT) is used as a material of the piezoelectric body. Lead-based piezoelectric ceramics represented by PZT has various excellent characteristics such as a high piezoelectric constant and is used for various electronic components such as a piezoelectric actuator, a pyroelectric infrared detecting device, and a nonvolatile memory device.

As a configuration of a piezoelectric element, JP-A-2001-284671 discloses a diaphragm-type piezoelectric element in which a vibrating plate is formed on a substrate having a pressure chamber hole formed therein so as to cover the pressure chamber hole and a lower electrode, a piezoelectric body, and an upper electrode are formed on the vibrating plate.

For example, JP-A-05-286131 suggests a technology of forming a homogeneous piezoelectric body in a layered structure on the whole surface of a vibrating plate by the use of a film forming method, dividing the piezoelectric body to correspond to individual pressure chambers by the use of a lithography method, and forming independent piezoelectric elements by pressure chambers.

For example, JP-A-2005-210887 suggests a structure in which an upper electrode of a piezoelectric element is drawn and a lead electrode is patterned from a peripheral edge of the upper electrode to the outside of a peripheral wall of a pressure chamber.

However, in the above-mentioned conventional structures, when the upper electrode, the piezoelectric body, and the lower electrode are stacked and a portion (hereinafter, referred to as piezoelectric active region) for substantially generating pressure in the pressure chamber protrudes from the pressure chamber region to the outside of the peripheral wall of the pressure chamber (that is, to the outside of the edge portion of the pressure chamber), the pressure generated from the piezoelectric active region cannot be effectively transmitted to ink, thereby causing the non-uniform pressure generation from the pressure chamber region.

In addition, cracks can occur in the lead electrode at the boundary between the pressure chamber and the peripheral wall. When cracks occur in the lead electrode, the lead electrode may be short-circuited or leak current may flow in the piezoelectric body.

SUMMARY

The invention is contrived to solve the above-mentioned problems. An object of the invention is to provide a piezoelectric element with high efficiency, high driving durability, and high reliability without causing cracks in a piezoelectric body in a region corresponding to an edge portion of a pressure chamber, a lead electrode, and an FPC substrate mounting portion.

In order to accomplish the above-mentioned object, according to an aspect of the invention, there is provided a piezoelectric element including: a pressure chamber member that has an opening communicating with a nozzle; a vibrating plate that is disposed on the pressure chamber member so as to cover the opening; a lower electrode that is disposed on the vibrating plate; a piezoelectric body that is disposed on the lower electrode; an upper electrode that is disposed on the piezoelectric body and in a region opposed to the opening; and a lead electrode that is disposed on the piezoelectric body, that extends from the upper electrode, and that has a width smaller than that of the upper electrode. Here, the piezoelectric body includes: a groove portion that is disposed in a predetermined region along an edge portion of the opening; and an inactive region that is a region other than the groove portion, that is disposed along the edge portion of the opening, and that does not substantially serve as a piezoelectric element. The lead electrode is disposed in the inactive region.

According to the invention, in the piezoelectric element formed above the edge portion of the pressure chamber hole, a stress at the time of driving the piezoelectric element is reduced to prevent destruction due to cracks.

BRIEF DESCRIPTION OF THE DRAWINGS

FIG. 17(a) is a diagram illustrating a piezoelectric body dividing process in the piezoelectric element according to the first embodiment of the invention and FIG. 17(b) is a diagram illustrating a pressure chamber member cutting process.

DETAILED DESCRIPTION

First Embodiment

Figure 1:
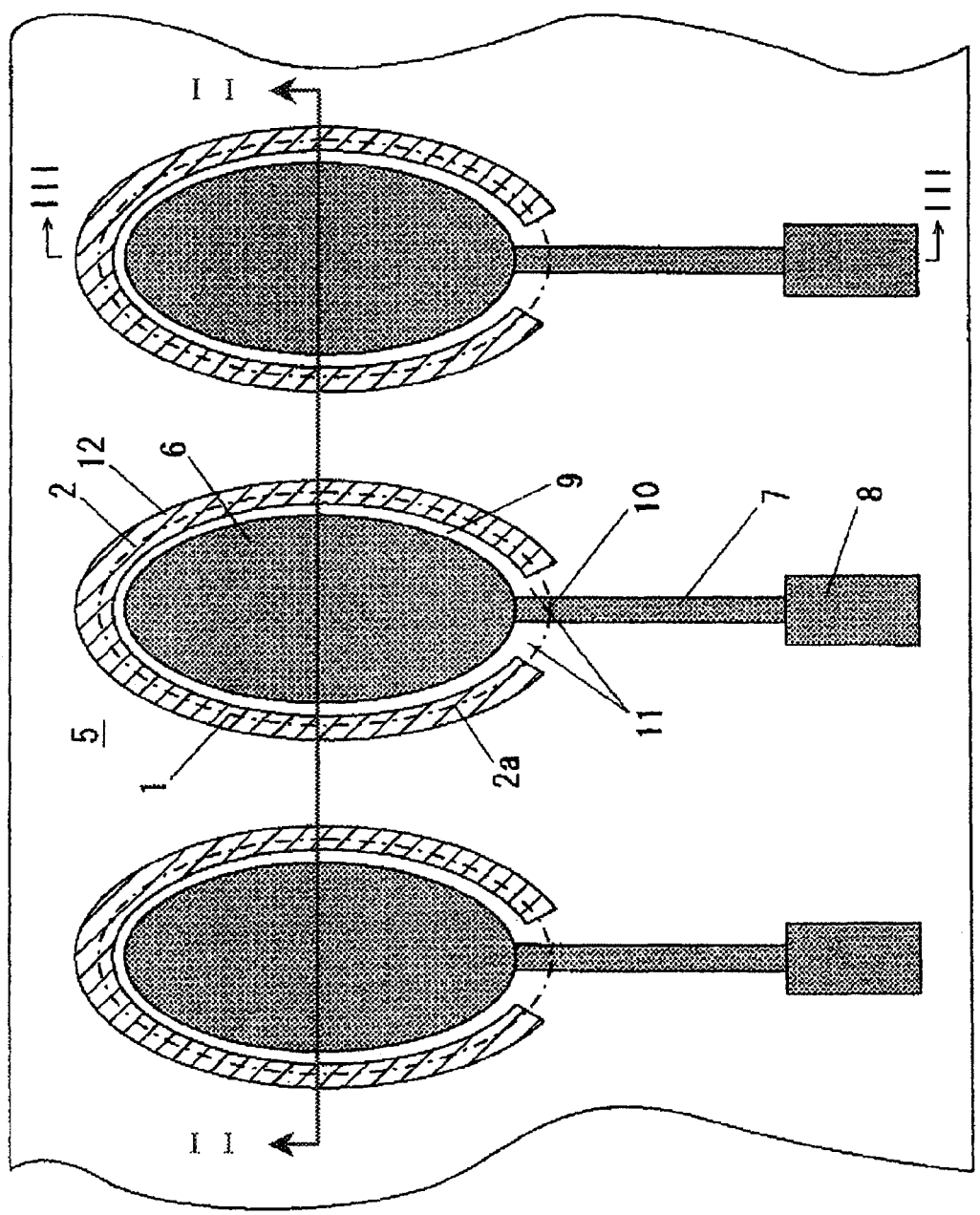
FIG. 1 is a plan view illustrating a piezoelectric element according to a first embodiment of the invention.

In order to improve deformation efficiency of a vibrating plate with the driving of a piezoelectric element, a structure for reducing the thickness of the vibrating plate in a peripheral portion of the piezoelectric element has been suggested. However, such a structure may cause an occurrence of cracks at the boundary between a pressure chamber and a peripheral wall thereof.

The problem with the cracks may easily occur particularly when a piezoelectric body is formed by the use of a film forming technology. This is because a layered piezoelectric body (piezoelectric thin film) formed by the use of the film forming technology is very thin and thus the residual stress in the course of a film forming process remains. Therefore, the rigidity thereof is smaller than that when the piezoelectric body is formed by adhesion. Particularly, cracks tend to easily occur in the piezoelectric body having a column-shaped structure formed by controlling crystal growth.

When the piezoelectric body is formed by the use of the film forming technology, there is an advantage that an increase in precision and an increase in density for forming a pattern can be easily carried out in the manufacturing process using a lithography method. However, various problems in design should be still solved to increase the element density.

That is, in order to arrange piezoelectric elements on a plane with a high density, it is necessary to reduce gaps between the piezoelectric elements. Accordingly, a study for employing plural lines like a zigzag arrangement or arranging elements as many as possible in the same area has been made. However, in such a structure, a wiring work is carried out on the same plane, thereby causing a problem that lead wires should be arranged between the piezoelectric elements.

In the course of manufacturing a piezoelectric element, damage such as cracks may be made in the piezoelectric body, in addition to the boundary between a pressure chamber and a peripheral wall thereof. Specifically, since the piezoelectric element formed by the film forming technology has the residual stress, the stress balance falls down with advance of the manufacturing process, thereby causing cracks.

That is, cracks occur in a stress concentrated portion or a portion weak to stress in the piezoelectric body due to an electrode patterning process and a piezoelectric body etching process or an annealing process accompanied with the processes. When the cracks reach a lead electrode portion, the lead electrode is broken. This is a problem with stress control in the piezoelectric element manufacturing process. However, since there is process non-uniformity, it is very difficult to suppress the cracks.

Even when an FPC substrate is mounted on a pad portion disposed at an end of a lead electrode extending from an upper electrode, damage such as cracks is made in the piezoelectric body due to the pressing operation at the time of mounting, thereby breaking the lead electrode. Alternatively, particles get bitten in at the time of mounting and thus cracks are made in the piezoelectric body, thereby short-circuiting the upper electrode and the lower electrode due to the cracks. Alternatively, leak current is generated at the time of driving for a long time. As a result, reliability is deteriorated.

The invention is contrived to solve the above-mentioned problems.

Hereinafter, embodiments of the invention will be described in detail with reference to the drawings.

FIG. 1 is a plan view illustrating a piezoelectric element according to a first embodiment of the invention.

Figure 2:
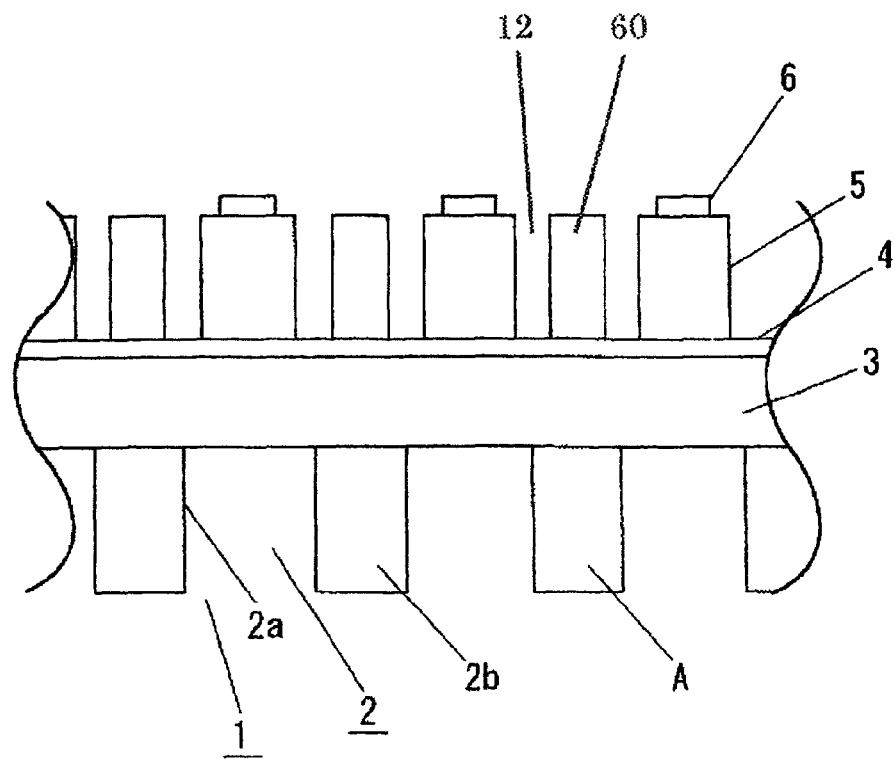
FIG. 2 is a sectional view of the piezoelectric element according to the first embodiment of the invention.

FIG. 2 is a sectional view of the piezoelectric element according to the first embodiment of the invention and shows a section taken along line II-II of FIG. 1.

Figure 3:
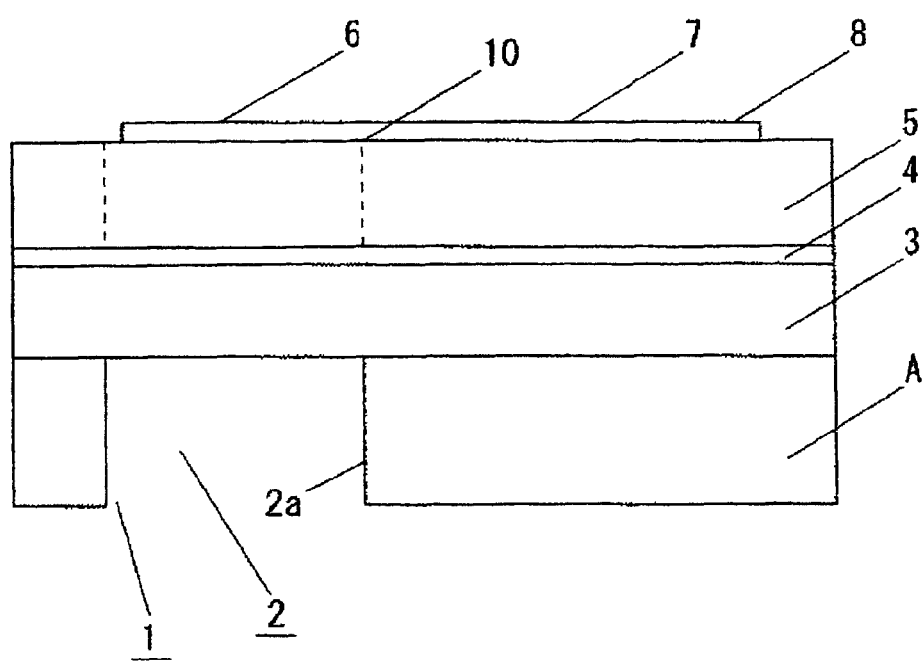
FIG. 3 is a sectional view of the piezoelectric element according to the first embodiment of the invention.

FIG. 3 is a sectional view of the piezoelectric element according to the first embodiment of the invention and shows a section taken along line III-III of FIG. 1.

As shown in FIGS. 1 to 3, plural elliptical pressure chamber holes 1 (which are indicated by dot-chained lines in FIG. 1) forming pressure chambers 2 are formed in a panel-shaped pressure chamber member A (where the pressure chamber holes 1 are openings formed in the pressure chamber member A). A vibrating plate 3 is disposed on one surface of the pressure chamber member A so as to cover the pressure chamber holes 1.

In the pressure chamber member A, as described later, a nozzle 108 (nozzle orifice) is formed on the surface opposite to the surface provided with the vibrating plate 3 (see FIG. 18; Reference numeral 108 in FIG. 18 denotes the nozzle and reference numeral 102 denotes a pressure chamber. The pressure chamber hole 101 as the opening is disposed to communicate with the nozzle 108).

The elliptical pressure chamber holes 1 (pressure chambers 2) are arranged with a predetermined interval in the length direction of the pressure chamber member A and the vibrating plate 3 is disposed to cover (or close) the pressure chamber holes 1. A lower electrode 4 is disposed on the vibrating plate 3, a piezoelectric body 5 is disposed on the lower electrode 4, an upper electrode 6 is disposed on the piezoelectric body 5, and a lead electrode 7 is drawn from the upper electrode 6. The vibrating plate 3, the lower electrode 4, the piezoelectric body 5, and the upper electrode 6 are formed as a laminated body by the use of a sputtering method.

The piezoelectric body 5 on the boundary (hereinafter, referred to as "edge portion 2a of the opening") between the elliptical pressure chamber hole 1 and peripheral wall 2b thereof is removed with a predetermined width in such a depth that it reaches the lower electrode 4, that is, in such a depth that it reaches the surface of the lower electrode 4, so as to face the edge portion 2a of the opening (more specifically, to overlap with the edge portion 2a of the opening). That is, an elliptical groove portion 12 with a predetermined width forming (surrounding) an elliptical peninsula-shaped piezoelectric active region 9 is disposed in the plane area of the pressure chamber holes 1.

The vibrating plate 3 and the lower electrode 4 can be combined into a conductive member (for example, which is formed by sputtering Cr). In this case, the groove portion 12 is formed in a region overlapping with the edge portion 2a of the opening with such a depth to reach the surface of the conductive member.

The depth of the groove portion 12 is enough so long as it reaches the surface of the lower electrode 4 or the conductive member serving both as vibrating plate 3 and the lower electrode 4 and may be such a depth that it reaches the inside of the lower electrode 4 or the conductive member serving both as the vibrating plate 3 and the lower electrode 4. In the process of manufacturing the piezoelectric element, even when it is intended to remove only the piezoelectric body 5 by the use of etching, the groove portion 12 reaches the lower electrode 4 or the like. The invention does not exclude such a situation.

When the permeation of ink to the upper electrode 6 can be prevented by the vibrating plate 3, the lower electrode 4 may be removed without any problem. That is, the groove portion 12 penetrates the lower electrode 4 and reaches the vibrating plate 3.

A region having the piezoelectric body 5 between the upper electrode 6 and the lower electrode 4 and a "remaining piezoelectric region 60" having the lower electrode 4 and the piezoelectric body 5 but not having the upper electrode 6 are partitioned by the groove portion 12 (see FIG. 2).

Here, the region having the piezoelectric body 5 between the upper electrode 6 and the lower electrode 4 forms a piezoelectric active region 9. The piezoelectric active region 9 is a portion substantially serving as a piezoelectric element and the piezoelectric body 5 interposed therebetween is deformed with an application of a voltage across the lower electrode 4 and the upper electrode 6. As a result, the vibrating plate 3 is deformed convex toward the pressure chamber 2 and a pressure is thus applied to the pressure chamber 2 covered with the vibrating plate 3. Ink (not shown) filled in the pressure chamber 2 is ejected from the nozzle (not shown).

As clearly shown in FIG. 1, the groove portion 12 is not disposed over the entire edge portion 2a of the opening. That is, the groove portion 12 is not formed in the region where the lead electrode 7 drawn from the upper electrode 6 is disposed. The region where the groove portion 12 is not formed is an inactive region (hereinafter, referred to as piezoelectric inactive region 11) not substantially serving as the piezoelectric element and is a discontinuous region because it is divided by the lead electrode 7 as shown in FIG. 1).

The elliptical upper electrode 6 is disposed in the plane area of the piezoelectric active region 9.

The discontinuous region (piezoelectric inactive region 1) of the groove portion 12 is a region where the piezoelectric body 5 is not removed and is a region connecting the piezoelectric body 5 of the piezoelectric active region 9 to the piezoelectric body 5 other than the groove portion 12.

The lead electrode 7 is drawn with a width smaller than the width of the upper electrode 6 from an end of the elliptical upper electrode 6. The lead electrode 7 is disposed on the piezoelectric inactive region 11 and extends to a pad portion 8, which is mounted with an FPC, over the edge portion 2a of the opening.

In this configuration, the edge portion 2a of the opening forms a vibration restricting region 10 of the piezoelectric body 5. That is, with respect to the edge portion 2a of the opening, the upper electrode 6 side is displaced as the piezoelectric element but the pad portion 8 side is not displaced. Accordingly, the vibration restricting region 10 is a portion on which the bending due to the deformation of the piezoelectric body is concentrated, thereby easily generating cracks based on metal fatigue.

In order to increase the density of the piezoelectric elements, it is necessary to reduce the element interval. When plural lines are arranged like a zigzag arrangement, it is necessary to dispose lead wires (not shown) between some elements. The ring-shaped groove portion 12 is determined in width depending on the density, but it is preferable that the groove width is greater at least than the layer thickness (film thickness) of the piezoelectric body 5 in view of precision of an etching process or positional precision (FIG. 2 seems to show that the groove width is smaller than the film thickness by deformation).

The width of the groove portion 12 may be enhanced up to the position which does not affect a wiring portion or an adjacent piezoelectric element.

It can be considered that the groove portion 12 is disposed outside the edge portion 2a of the opening. However, in this case, the piezoelectric body 5 is disposed in the region overlapping with the edge portion 2a of the opening. Accordingly, since the region of the piezoelectric body 5 overlapping with the edge portion 2a of the opening serves all as the vibration restricting region, cracks may occur in this region. The vibration restricting region increases, thereby not efficiently transmitting the pressure generated from the piezoelectric body 5 to the ink.

According to the first embodiment, since the most piezoelectric body 5 at the peripheral edge of the piezoelectric active region 9 covered with the upper electrode 6 is removed by the groove portion 12, the deformation efficiency of the vibrating plate 3 due to the driving of the piezoelectric element is improved and the difference in deformation between the piezoelectric elements is reduced. Since the piezoelectric body 5 in a region which can serve as the vibration restricting region in the piezoelectric active region 9 is removed by the groove portion 12, cracks do not occur in the piezoelectric body 5 around the groove portion 12 formed in a ring shape, thereby securing high reliability.

As described above, the lead electrode 7 is drawn to the pad portion 8 over the edge portion 2a of the opening. In the lead electrode 7, since the vibration restricting region 10 located just above the edge portion 2a of the opening serves as a deformation restricting point of the piezoelectric body 5, damage such as cracks can easily occur in the piezoelectric body 5 due to a stress. Accordingly, the stress applied to the lead electrode 7 is reduced by decreasing the width of the lead electrode 7 than that of the upper electrode 6 and drawing the lead electrode 7 into the piezoelectric inactive region 11 which is a region not substantially serving as the piezoelectric element.

Next, a method of manufacturing the piezoelectric element according to the first embodiment will be described with reference to FIGS. 14 to 17.

Figure 14A:
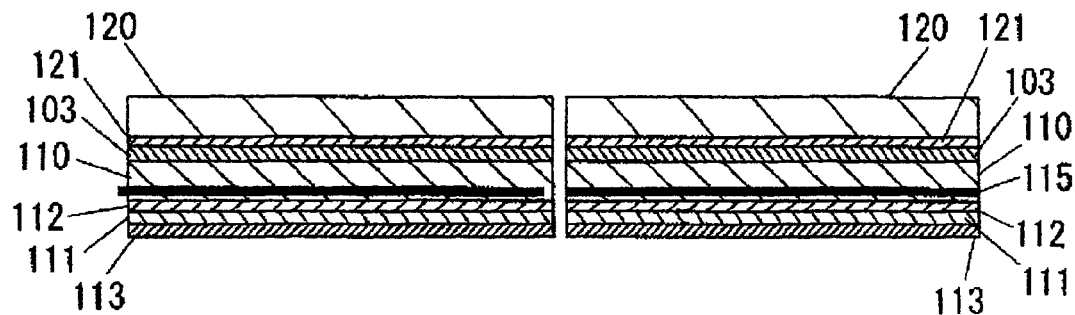
FIG. 14(a) is a diagram illustrating a laminating process of the piezoelectric element according to the first embodiment of the invention.
Figure 14B:
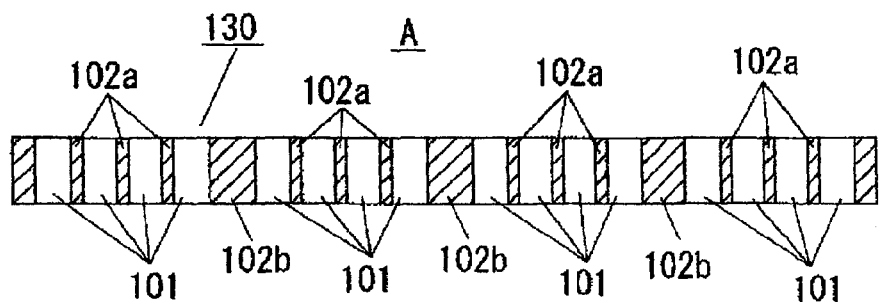
FIG. 14(b) is a diagram illustrating a pressure chamber hole forming process.
Figure 14C:
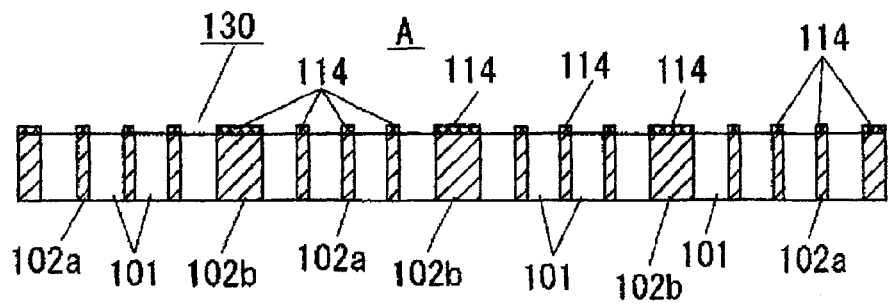
FIG. 14(c) is a diagram illustrating an adhesive attaching process.

FIG. 14(a) is a diagram illustrating a laminating process of the piezoelectric element according to the first embodiment of the invention, FIG. 14(b) is a diagram illustrating a pressure chamber hole forming process, and FIG. 14(c) is a diagram illustrating an adhesive attaching process.

As shown in FIG. 14(a), a contact layer 121, an upper electrode 103, a layered piezoelectric body 110 (corresponding to the piezoelectric body 5 in FIG. 1), and an insulator layer 115 are sequentially formed on a substrate 120 (the top and bottom are inverted in the figure). The insulator layer 115 is patterned in a predetermined shape to cover the lead electrode 7 and the pad portion 8 (see FIG. 1 and the like). The lower electrode 112 and the vibrating plate 111 are formed and laminated by the use of a sputtering method.

The contact layer 121 is formed between the substrate 120 and the upper electrode 103 so as to enhance the close contact property between the substrate 120 and the upper electrode 103. When the close contact property is high, the contact layer 121 is not necessarily formed. The contact layer 121 is removed similarly to the substrate 120 as described later. The vibrating plate 111 is made of Cr.

The substrate 120 is a Si substrate having a size of 18 mm$^2$. The substrate 120 is not limited to the Si substrate, but may be formed of a glass board, a metal board, or a ceramic board. The substrate size is not limited to the 18 mm$^2$, but a wafer of φ2 to φ10 may be used as the Si substrate.

The contact layer 121 can be obtained by using a Ti target and applying RF power of 100 W while heating the substrate 120 at 400° C. to bake the substrate in the atmosphere of argon of 1 Pa for 1 minute.

In this condition, the thickness of the contact layer 121 is 0.02 μm. The material of the contact layer 121 is not limited to Ti, but may be tantalum, iron, cobalt, nickel, chromium, or compounds (including Ti) thereof. The thickness is in the range of 0.005 μm to 0.2 μm.

The upper electrode 103 can be obtained by using a Pt target and baking the substrate 120 with RF power of 200 W in the atmosphere of argon of 1 Pa for 12 minutes while heating the substrate at 600° C.

In this condition, the thickness of the upper electrode 103 is 0.2 μm and is oriented in the face (111). The material of the upper electrode 103 may be at least one or compounds selected from a group consisting of Pt, iridium, palladium, and ruthenium and the thickness thereof is in the range of 0.05 μm to 2 μm.

The piezoelectric body 110 is formed by the use of a multiple sputtering apparatus. A sintered target of PZT (Zr/Ti=53/47, Pb is excessive by 20 mol %) having Pb composition greater than a stoichiometric composition is used as the target. By heating the substrate in advance with a heater in vacuum and baking the substrate in the atmosphere of argon and oxygen (gas volume ratio Ar:$O_2$=15:5) at the temperature of the substrate 120 of 580° C. for 180 minutes under the condition of a degree of vacuum of 0.3 Pa and RF power of 250 W, a film with a thickness of 3 μm is deposited.

The Zr/Ti composition of the piezoelectric body 110 is in the range of Zr/Ti of 30/70 to 70/30 and the thickness is in the range of 1 to 5 μm. The piezoelectric body 110 may be formed of a piezoelectric material containing PZT as a major component, such as a mixture in which additives such as La, Sr, Nb, and Al are added to the PZT, or PMN or PZN.

In the sectional SEM of the piezoelectric body 110 formed under the above-mentioned sputtering condition, the crystal has a column-shaped structure and the diameter of the column-shaped particle is 0.2 μm.

The insulator layer 115 is formed by applying a photosensitive polyimide resin by the use of a spin coating method, patterning the applied resin in a predetermined shape through exposure and removal processes, and then baking and hardening the resultant structure at a predetermined temperature. In another method, a film may be formed of an inorganic material such as $SiO_2$ by the use of a sputtering method.

The lower electrode 112 can be formed by using a Pt target and baking the substrate in the atmosphere of argon of 1 Pa with RF power of 200 W at the room temperature for 10 minutes.

In this condition, the thickness of the lower electrode 112 is 0.2 μm. The material of the lower electrode 112 is not limited to Pt, but may be any conductive material. The thickness thereof is preferably in the range of 0.1 μm to 0.4 μm.

The vibrating plate 111 can be formed by using a Cr target and baking the substrate in the atmosphere of argon of 1 Pa with RF power of 200 W at the room temperature for 6 hours.

In this condition, the thickness of the vibrating plate 111 is 0.3 μm. The material of the vibrating plate 111 is not limited to Cr, but may be nickel, aluminum, tantalum, tungsten, silicon, or oxide or nitride thereof (such as silicon dioxide, aluminum oxide, zirconium oxide, and silicon nitride). The thickness of the vibrating plate 111 is preferably in the range of 1 μm and 10 μm.

On the other hand, as shown in FIG. 14(b), the pressure chamber member A is formed.

Figure 19:
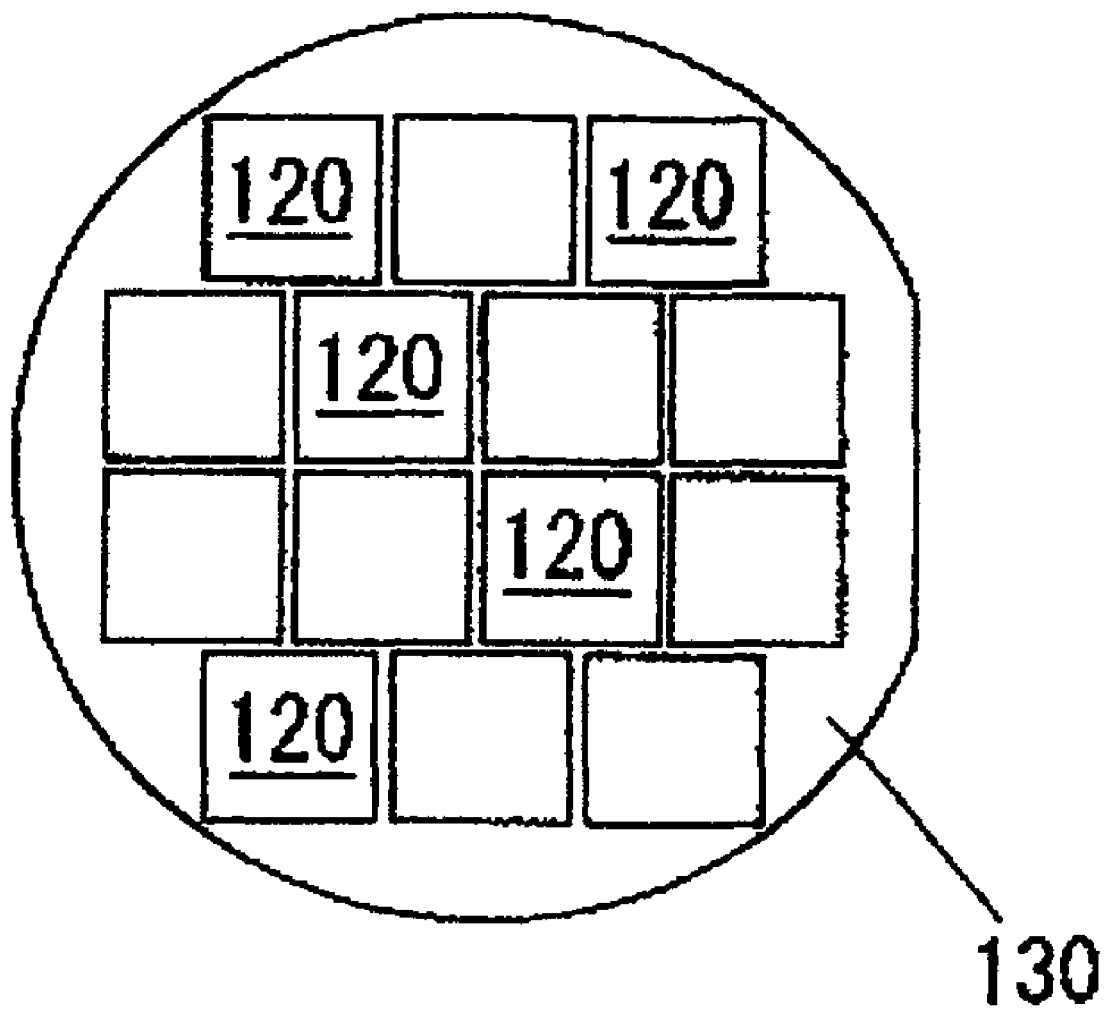
FIG. 19 is a diagram illustrating a substrate on which the pressure chamber member of the piezoelectric element according to the first embodiment of the invention is formed.

FIG. 19 is a diagram illustrating a substrate on which the pressure chamber member of the piezoelectric element according to the first embodiment of the invention is formed.

As shown in FIG. 19, the pressure chamber member A is formed of a Si substrate 130 having a size larger than the substrate 120, for example, a 4-inch wafer.

Figure 4:
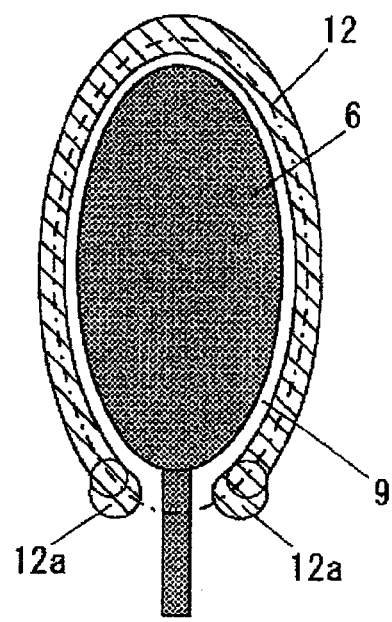
FIG. 4 is a plan view illustrating a piezoelectric element according to Modified Example 1 of the first embodiment of the invention.

Specifically, shapes of plural pressure chamber holes 101 are first patterned in the Si substrate 130 (for the pressure chamber member). In this patterning process, as shown in FIG. 14(b), 4 pressure chamber holes 101 form a set and the thickness of a partition wall 102b defining each set is about twice the thickness of a peripheral wall 102a defining the pressure chamber holes 101 of each set.

Next, by etching the patterned Si substrate 130 by the use of a chemical etching method or a dry etching method, the pressure chamber member A can be obtained in which the plural pressure chamber holes 101 are arranged in the length direction thereof.

Next, the substrate 120 on which films have been formed and the pressure chamber member A are adhered to each other with an adhesive. The application of the adhesive is performed by electrodeposition. That is, first as shown in FIG. 14(c), the adhesive 114 is applied to the top surfaces of the partition walls 102b and the peripheral walls 102a of the pressure chambers as the electrodeposition surface of the pressure chamber member A by electrodeposition.

Specifically, although not shown, a Ni film with a thickness of several hundreds A which is thin enough to transmit light is formed an underlying electrode film on the top surfaces of the partition walls 102b and the peripheral walls 102a by the use of a sputtering method. Then, the adhesive 114 which becomes a patterned resin adhesive layer is formed on the Ni film.

As an electrodeposition solution, a solution obtained by adding pure water of 0 to 50 wt % to an acryl resin-based water dispersion and stirring the mixture is used. The reason for making the Ni film be thin enough to transmit light is to easily recognize that the resin adhesive is completely applied to the Si substrate 130 (pressure chamber member A).

According to experiments, the electrodeposition condition preferably includes a liquid temperature of about 25° C., a DC voltage of 30 V, and a turn-on time of 60 seconds and acryl resin of about 3 to 10 μm is electrodeposited on the Ni film of the Si substrate 130 (pressure chamber member A) under this condition.

Figure 15A:
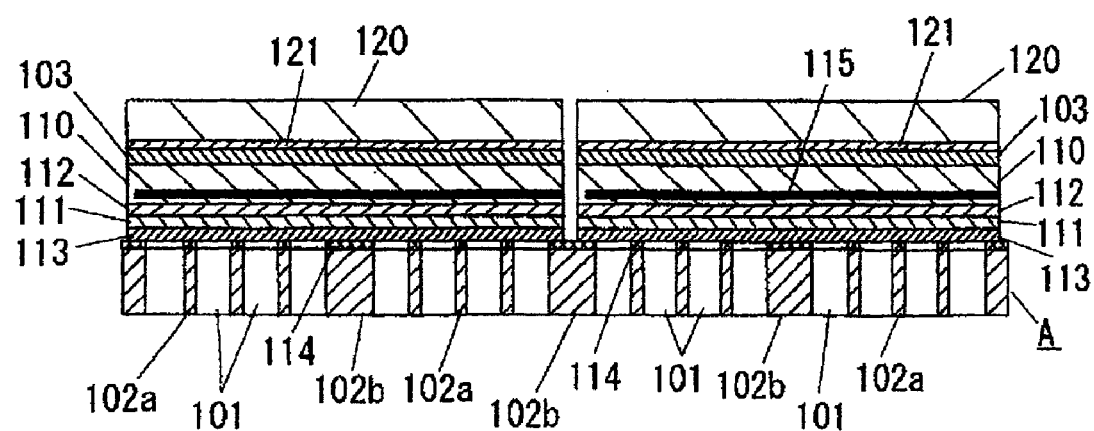
FIG. 15(a) is a diagram illustrating a process of bonding a film-formed substrate and a pressure chamber member in the piezoelectric element according to the first embodiment of the invention and FIG. 15(b) is a diagram illustrating a vertical wall forming process.
Figure 15B:
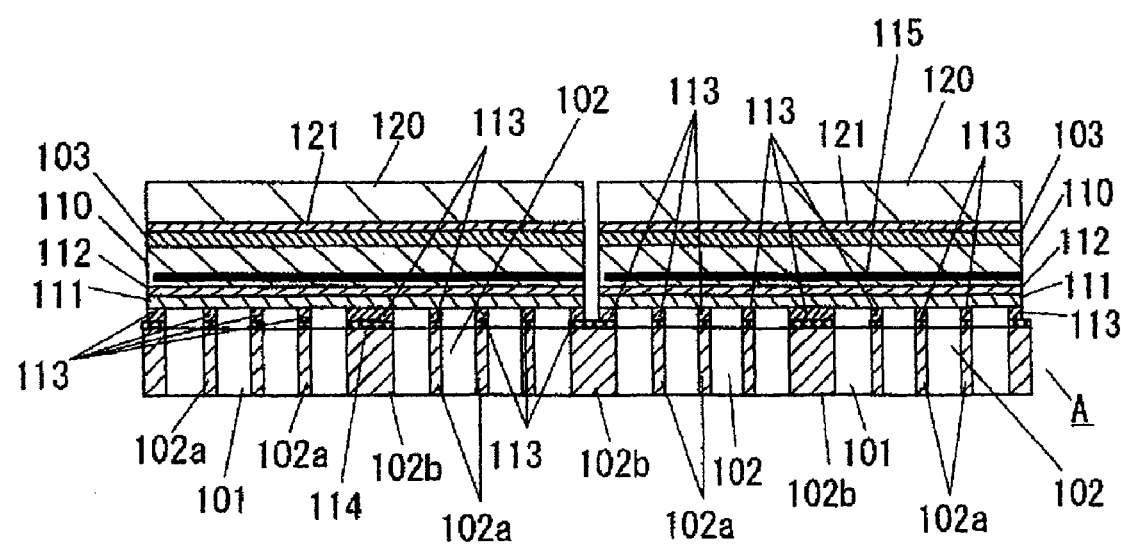

FIG. 15(a) is a diagram illustrating a process of attaching the film-formed substrate and the pressure chamber member in the piezoelectric element according to the first embodiment of the invention and FIG. 15(b) is a diagram illustrating a vertical wall forming process.

As shown in FIG. 15(a), the film-formed substrate 120 and the pressure chamber member A are attached to each other with the electrodeposited adhesive 114. At this time, the intermediate layer 113 formed on the substrate 120 is used as a substrate-side adhesive surface.

The film-forming substrate 120 has a size of 18 mm² and the Si substrate 130 forming the pressure chamber member A has a size of 4 inches. Accordingly, as shown in FIG. 19, the plural substrates 120 (14 in FIG. 19) are attached to one pressure chamber member A (Si substrate 130). This attachment, as shown in FIG. 15(a), is performed so that the centers of the substrates 120 are positioned at the centers of the partition walls 102b of the pressure chamber member A.

After the attachment of the substrates 120, the pressure chamber member A is pressed on the substrates 120, thereby enhancing the liquid-tightness. Then, the substrates 120 and the pressure chambers A are slowly heated to rise in temperature, thereby completely hardening the adhesive 114. By performing a plasma process after the hardening, the adhesive 114 protruding from the attachment portion to the pressure chamber holes 101 is removed.

Although the film-formed substrates 120 and the pressure chamber member A are attached to each other, the Si substrate 130 (for the pressure chamber member) may be attached to the film-formed substrates 120 before forming the pressure chamber holes 101.

Next, as shown in FIG. 15(b), the intermediate layer 113 is etched using the partition walls 102b and the peripheral walls 102a of the pressure chamber member A, thereby forming a vertical wall shape continuous to the partition walls 102b and the peripheral walls 102a.

The edge portion of the peripheral wall 102a correspond to the edge portion 2a of the opening described with reference to FIG. 3.

Figure 16A:
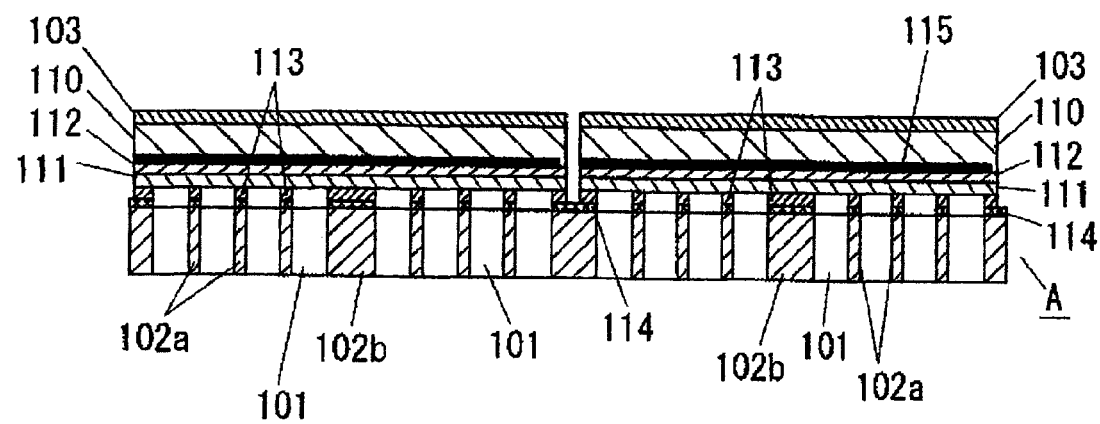
FIG. 16(a) is a diagram illustrating a process of removing a film forming substrate and a contact layer in the piezoelectric element according to the first embodiment of the invention and FIG. 16(b) is a diagram illustrating an upper electrode dividing process.
Figure 16B:
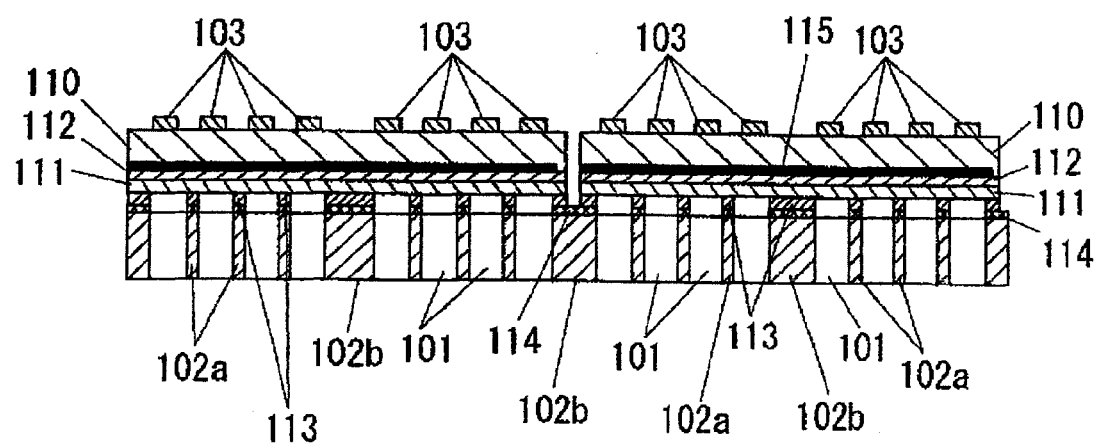

FIG. 16(a) is a diagram illustrating a process of removing the film forming substrate and the contact layer in the piezoelectric element according to the first embodiment of the invention and FIG. 16(b) is a diagram illustrating an upper electrode dividing process.

As shown in FIG. 16(a), the film forming substrate 120 and the contact layer 121 are etched and removed.

Next, as shown in FIG. 16(b), the layer of the upper electrode 103 is etched by the use of photolithography and is divided to correspond to the piezoelectric active regions 9 (see FIG. 1 and the like) formed on the pressure chamber holes 101 of the pressure chamber member A. At the same time, the lead electrode 7 extending from each upper electrode 103 (corresponding to reference numeral 6 of FIG. 1) and the pad portion 8 (see FIG. 1 and the like) are etched into a predetermined shape. In FIG. 16(b), the lead electrode 7 and the pad portion 8 are formed perpendicularly to the drawing sheet and thus are not shown in the figure.

FIG. 17(a) is a diagram illustrating a piezoelectric body dividing process for the piezoelectric element according to the first embodiment of the invention and FIG. 17(b) is a diagram illustrating a pressure chamber member cutting process.

As shown in FIG. 17(a), a patterning process is performed by applying and removing a photosensitive resin, so that the piezoelectric bodies 110 are in the form of plural peninsula shapes of piezoelectric active regions 9 (see FIG. 1) and narrow base portions (piezoelectric inactive regions 11 (see FIG. 1)) of the peninsulas, and the groove portions 12 (see FIG. 1 and the like) are formed by the use of a dry etching method. As described above, the groove portions 12 are formed with such a depth that they reach the lower electrodes 112. The piezoelectric active regions 9 are formed in the plane areas of the pressure chamber holes 101 so that the centers of the upper electrodes 103 and the piezoelectric active regions are located at the centers of the pressure chamber holes 101 with high precision.

In FIGS. 17(a) and 17(b), for the purpose of avoiding the complication of the drawings, piezoelectric bodies ("remaining piezoelectric bodies 60" shown in FIG. 2) originally remaining between the divided piezoelectric bodies 110 are not shown, but they actually exist as shown in FIG. 2.

A shape of the groove wall that is formed by etching is a forward tapered shape in an inclined plane of the piezoelectric bodies 110 (piezoelectric inactive regions 11). The etching process employs a dry etching method, but may employ a wet etching method. In this way, the upper electrodes 103 and the piezoelectric bodies 110 are divided for each pressure chamber hole 101, thereby forming the piezoelectric elements. Although the pressure chamber member has been formed by the use of attachment in the first embodiment, the pressure chamber member may be formed directly on the vibrating plate by the use of a Ni plating method after the vibrating plate is formed.

In the first embodiment, the upper electrodes 103 and the like are sequentially laminated on the film-forming substrate 120 and then the film-forming substrate 120 after the lamination is removed. However, the vibrating plate 111 may be formed on the pressure chamber member A and then the lower electrode 112, the insulator layer 115, the piezoelectric body 110, and the upper electrode 103 may be sequentially formed. The insulator layer 115 may be formed between the piezoelectric body 110 and the upper electrode 103.

Figure 18:
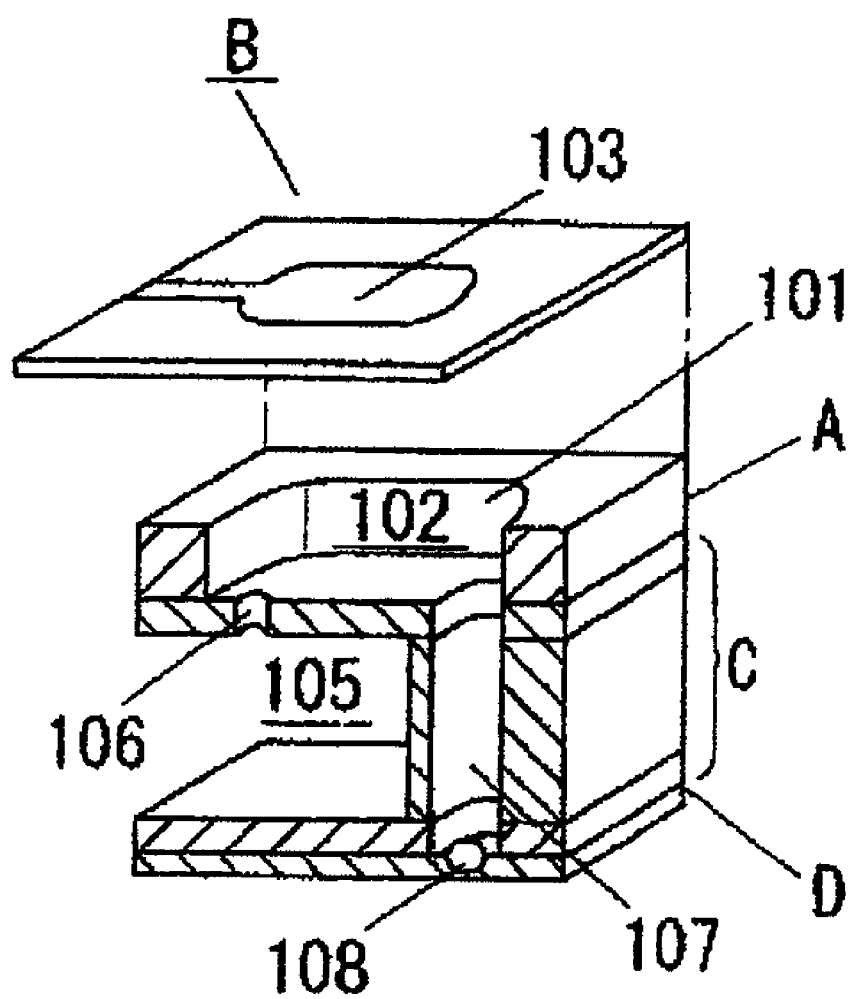
FIG. 18 is a diagram illustrating a partial configuration of an ink jet head employing the piezoelectric element according to the first embodiment of the invention.

FIG. 18 is a diagram illustrating a partial configuration of an ink jet head employing the piezoelectric element according to the first embodiment of the invention.

As shown in FIG. 18, the pressure chamber hole 101 penetrating the pressure chamber member in the thickness direction (vertical direction) thereof is formed in the pressure chamber member A. A piezoelectric element section B is disposed to cover the pressure chamber hole 101. An ink channel member C is disposed to cover the bottom of the pressure chamber hole 101. The top and bottom of the pressure chamber hole 101 are closed by the piezoelectric element section B and the ink channel member C, thereby forming pressure chambers 102.

The ink channel member C includes a common liquid chamber 105 common to the pressure chambers 102, a supply port 106 for supplying ink in the common liquid chamber 105 to the pressure chamber 102, and an ink channel 107 for ejecting the ink in the pressure chamber 102. A nozzle 108 communicating with the ink channel 107 is formed in the nozzle plate D attached to the bottom of the ink channel member C.

Next, a method of manufacturing an ink jet head employing the piezoelectric element according to the first embodiment of the invention will be described with reference to FIG. 20.

Figure 20A:
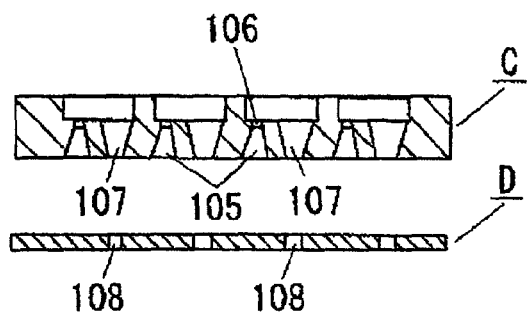
FIG. 20(a) is a diagram illustrating a process of forming an ink channel member and a nozzle plate of the ink jet head employing the piezoelectric element according to the first embodiment of the invention.
Figure 20B:
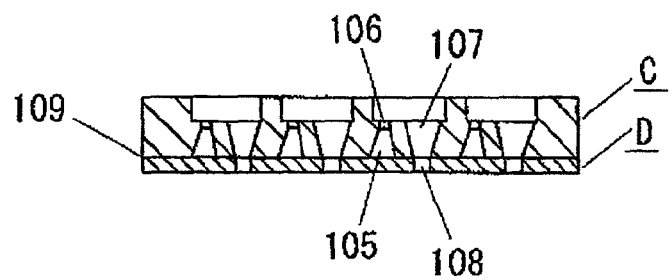
FIG. 20(b) is a diagram illustrating a process of adhering the ink channel member and the nozzle plate.
Figure 20C:
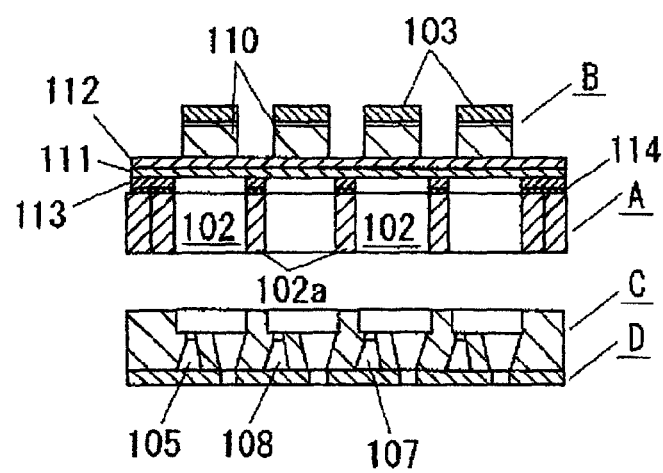
FIG. 20(c) is a diagram illustrating a process of adhering the pressure chamber member and the ink channel member.
Figure 20D:
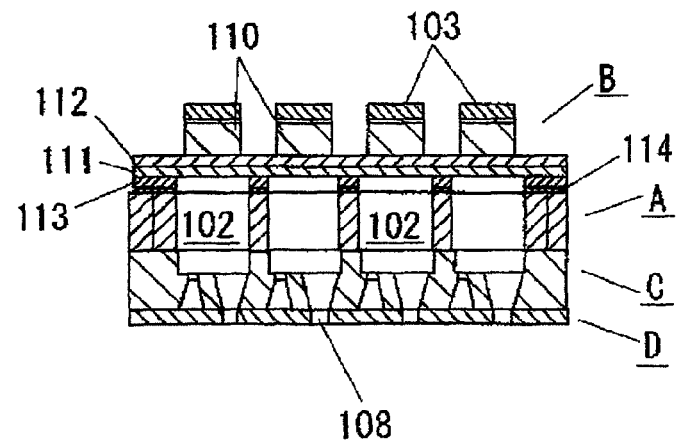
FIG. 20(d) is a diagram illustrating a completed ink jet head.

FIG. 20(a) is a diagram illustrating a process of forming an ink channel member and a nozzle plate of the ink jet head employing the piezoelectric element according to the first embodiment of the invention, FIG. 20(b) is a diagram illustrating a process of adhering the ink channel member and the nozzle plate, FIG. 20(c) is a diagram illustrating a process of adhering the pressure chamber member and the ink channel member, and FIG. 20(d) is a diagram illustrating a completed ink jet head.

As shown in FIG. 20(a), the common liquid chamber 105, the supply port 106, and the ink channel 107 are formed in an ink channel member C and the nozzle 108 is formed in a nozzle plate D.

Next, as shown in FIG. 20(b), the ink channel member C and the nozzle plate D are attached to each other with the adhesive 109.

Next, as shown in FIG. 20(c), an adhesive (not shown) is transferred to the bottom surface of the pressure chamber member A or the top surface of the ink channel member C.

Then, the pressure chamber member A and the ink channel member C are aligned and then are attached to each other with the adhesive.

In this way, the ink jet head having the pressure chamber member A, the piezoelectric element section B, the ink channel member C, and the nozzle plate D is completed as shown in FIG. 20(d).

In FIGS. 20(c) and 20(d), piezoelectric bodies ("remaining piezoelectric bodies 60" shown in FIG. 2) originally remaining between the divided piezoelectric bodies 110 are not shown, but they actually exist as shown in FIG. 2.

FIG. 4 is a plan view illustrating a piezoelectric element according to Modified Example 1 of the first embodiment. In Modified Example 1, a ring-shaped groove portion 12 forming (surrounding) a peninsula-shaped piezoelectric active region 9 in a plane area of each pressure chamber hole 1 is formed along the edge portion of the upper electrode 6 with a constant width, excluding the end portions thereof.

The greatest feature of Modified Example 1 is that the end portions 12a of the groove portion 12 is formed in a substantially circular shape with a width greater than the width of the groove portion 12 other than the end portions 12a.

Stress concentration on the end portions 12a of the groove portion 12 is reduced due to the above-mentioned shape. When it is intended to arrange the piezoelectric elements with a high density, the width of the groove portion 12 needs to be small in the longitudinal direction (direction in which the piezoelectric elements are arranged in a line) of the ink jet head. However, since the end portions 12a of the groove portion 12 are disposed in a so-called dead space between adjacent piezoelectric elements, the end portions are not restricted in arrangement of the piezoelectric elements.

The end portions 12a of the groove portion 12 are portions which can be called an intermediate region between the piezoelectric active region 9 and the piezoelectric inactive region 11 (see FIG. 1) and on which stress is greatly concentrated. Accordingly, by setting the above-mentioned shape, it is possible to effectively prevent the stress concentration on the end portions 12a.

As described above, in Modified Example 1, the groove portion 12 is disposed in the region in which it overlaps with the edge portion 2a of the opening and the groove portion 12 preferably has such a depth that it reaches the lower electrode 4 (see FIG. 2).

However, the technical advantage of Modified Example 1 is derived directly from the shape of the end portions 12a. Accordingly, the groove portion 12 need not be disposed to completely overlap with the edge portion 2a of the opening (but to comply with the edge portion 2a of the opening), and the groove portion 12 may not have such a depth that it reaches the lower electrode 4.

The shape of the end portions 12a of the groove portion 12 is substantially circular in Modified Example 1. However, since Modified Example 1 intends to reduce the stress on the intermediate region between the piezoelectric active region 9 and the piezoelectric inactive region 11, any shape may be used so long as it is a shape substantially effective for the reduction of stress.

That is, in the piezoelectric body 5 other than the vicinity of the region where the lead electrode 7 goes over the edge portion 2a of the opening, the groove portion 12 is formed along the edge portion 2a of the opening and the end portions 12a of the groove portion 12a facing the lead electrode 7 is formed in the form of curved line of which the side facing the lead electrode 7 is convex. Since the end portions 12a of the groove portion 12 have no portion (edge portion) on which the stress is concentrated, it is possible to enhance the reliability of the piezoelectric element.

In the first embodiment, the shapes of the piezoelectric active region 9 surrounded with the upper electrode 6 and the groove portion 12 are substantially elliptical. However, any other shape may be used so long as it can reduce the stress acting on the outer edge of the piezoelectric body 5 defining the piezoelectric active region 9. That is, in the plan view (top view), it can be a shape not having any edge portion and examples thereof may include an oval shape and a track shape of a stadium. The shape of the piezoelectric active region 9 may be close to a rectangle. That is, the basic shape of the piezoelectric active region 9 may be rectangular and the vertexes thereof may be replaced with a smooth curved line.

At this time, it is preferable that the groove portion 12 is configured to correspond to the shape of the piezoelectric active region 9 (along the edge of the piezoelectric active region 9). It is also preferable that the edge portion 2a of the opening is formed in this shape. That is, it is preferable that the edge portion 2a of the opening, the groove portion 12, and the piezoelectric active region 9 are similar to each other in shape.

Figure 5:
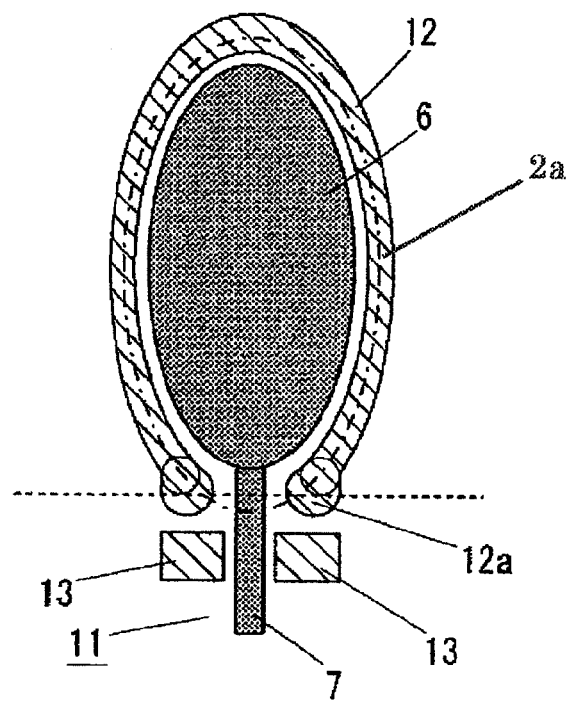
FIG. 5 is a plan view illustrating a piezoelectric element according to Modified Example 2 of the first embodiment of the invention.

FIG. 5 is a plan view illustrating a piezoelectric element according to Modified Example 2 of the first embodiment of the invention.

In Modified Example 2, holes 13 as concave portions formed by removing the piezoelectric body 5 (not shown) are formed in the piezoelectric body 5 (this portion is a region not serving as the piezoelectric element and corresponds to the piezoelectric inactive region 11) outside the end portions 12a of the groove portion 12 (outside the edge portion 2a of the opening) in a direction in which the lead electrode 7 is drawn. The holes 13 are determined in area depending on the arrangement density of the piezoelectric elements and are formed in such area and shape not to affect the adjacent piezoelectric elements.

It is preferable that the holes 13 have a depth that it reaches the lower electrode 4 (see FIG. 2).

Figure 6:
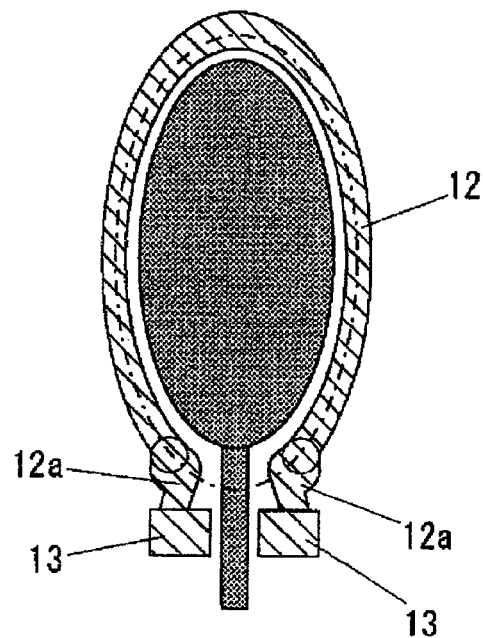
FIG. 6 is a plan view illustrating a piezoelectric element according to Modified Example 3 of the first embodiment of the invention.

FIG. 6 is a plan view illustrating a piezoelectric element according to Modified Example 3 of the first embodiment of the invention.

In Modified Example 3, the holes 13 and the end portions 12a of the groove portion 12, which are formed by removing the piezoelectric body 5 (not shown) in Modified Example 2 are made to communicate with each other.

In FIG. 6, the communication is made at two locations, but may be made at only one location to reduce the stress on the piezoelectric body 5.

Figure 7:
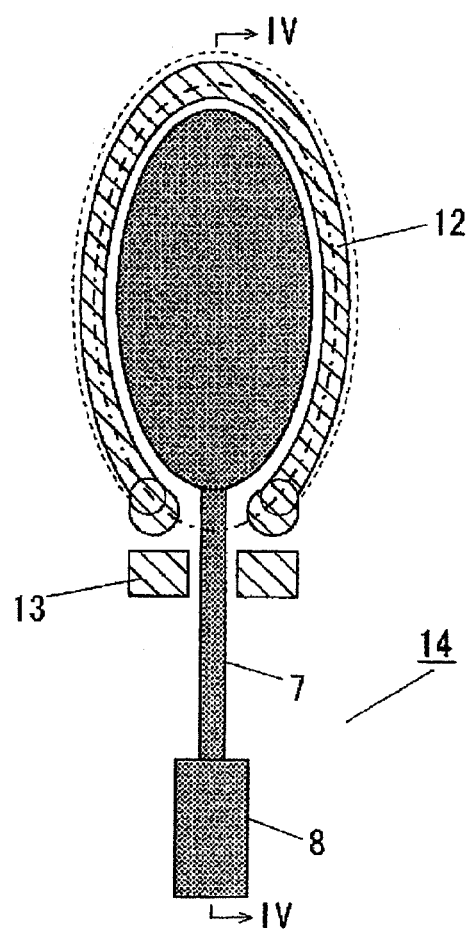
FIG. 7 is a plan view illustrating a piezoelectric element according to Modified Example 4 of the first embodiment of the invention.

FIG. 7 is a plan view illustrating a piezoelectric element according to Modified Example 4 of the first embodiment of the invention.

Figure 8:
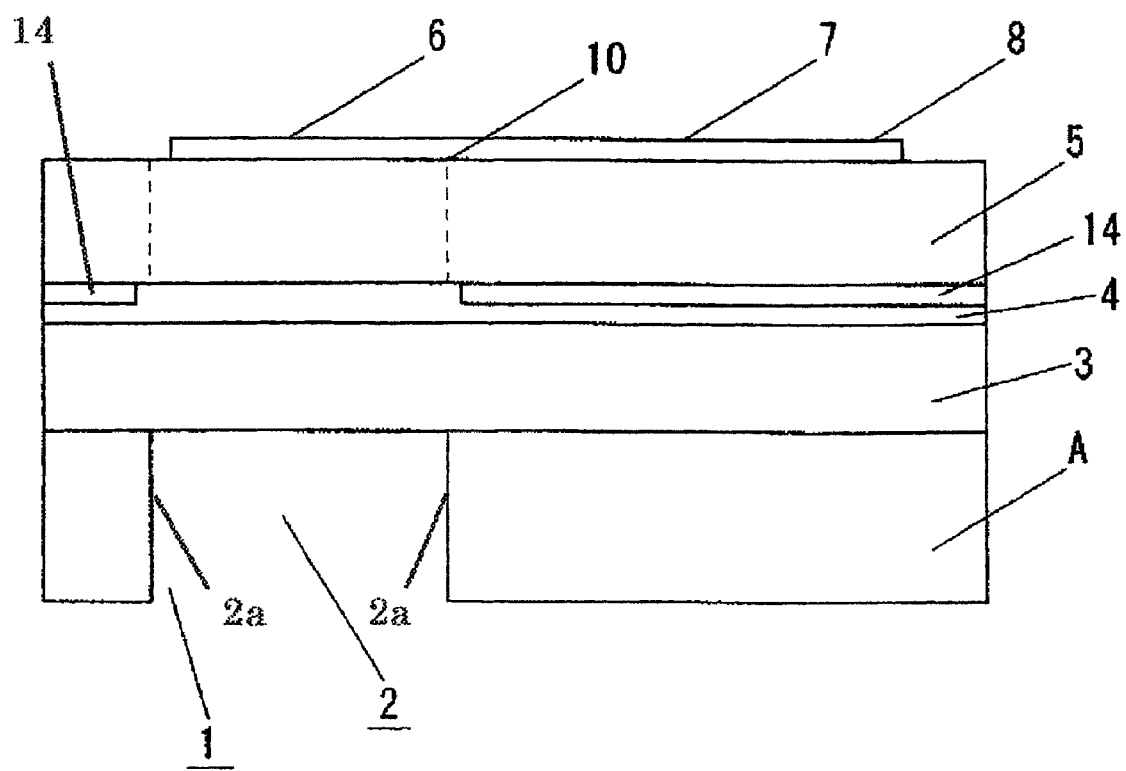
FIG. 8 is a sectional view illustrating the piezoelectric element according to Modified Example 4 of the first embodiment of the invention.

FIG. 8 is a sectional view illustrating the piezoelectric element according to Modified Example 4 of the first embodiment of the invention and a cross-sectional view taken along Line IV-IV of FIG. 7.

As shown in FIGS. 7 and 8, the insulator layer 14 is stacked and formed in a region outside of the pressure chamber hole 1 in the plan view and is disposed to cover the regions of the lead electrode 7 and the pad portion 8.

As shown in FIG. 8, in Modified Example 4, the insulator layer 14 is formed between the piezoelectric body 5 and the lower electrode 4, but the insulator layer 14 may be formed between the lead electrode 7 and the pad portion 8 and the piezoelectric body 5. The insulator layer 14 may be independently formed every piezoelectric element or may be formed two-dimensionally continuous in the entire region of the piezoelectric elements.

Figure 9:
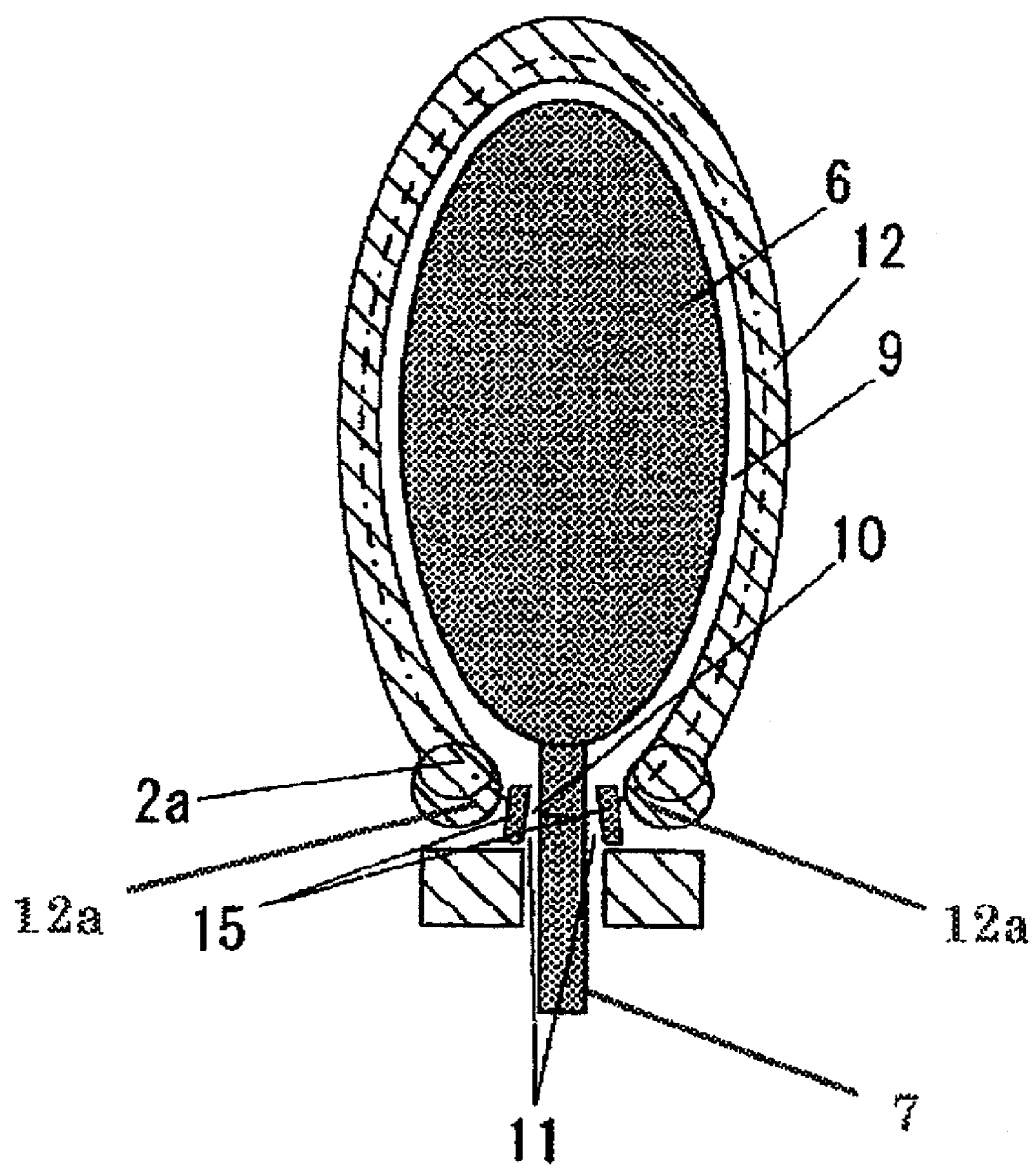
FIG. 9 is a plan view illustrating a piezoelectric element according to Modified Example 5 of the first embodiment of the invention.

FIG. 9 is a plan view illustrating a piezoelectric element according to Modified Example 5 of the first embodiment of the invention.

In Modified Example 5, anti-vibration portions 15 are formed on the surface of the piezoelectric inactive region 11 (between the end portions 12a of the groove portion 12 and the lead electrode 7), that is, on the surface of the piezoelectric body 5 (not shown), so as to be suspended on the edge portion 2a of the opening which is a boundary between the pressure chamber hole 1 and the peripheral wall 2b.

The anti-vibration portions 15 are made of the same material (Pt) as the upper electrode 6. The anti-vibration portions 15 can be formed in the same process as the process of patterning the upper electrode 6.

By forming the anti-vibration portions 15, it is possible to alleviate the bending deformation concentrated on the vibration restricting region 10 due to the vibration generated at the time of driving the piezoelectric active region 9.

In Modified Example 5, in order to simplify the procedure of manufacturing the piezoelectric element, the anti-vibration portions 15 are formed in the same thickness out of the same material as the upper electrode 6. The same thickness as the upper electrode 6 can provide a sufficient advantage, but may be made to increase. The anti-vibration portions 15 may be formed of a material different from that of the upper electrode 6 and may be formed preferably of a material having Young's modulus greater than that of the piezoelectric body 5.

Examples of the material of the anti-vibration portions 15 can include Pt, a multi layer of Ti/Pt, Ni, Cr, Ir, and Ir alloy. By using a material having great Young's modulus, it is possible to obtain a sufficient anti-vibration effect. The anti-vibration portions 15 may be formed by attaching a rigid or a sheet with an adhesive or directly by using a plating method or the like. In order to remove a difference in shape precision, it is preferable that the anti-vibration portions are formed by the use of a vapor deposition method.

The "vapor deposition method" includes a physical vapor deposition method (PVD method) and a chemical vapor deposition method (CVD method). Specific example of the physical vapor deposition method include a resistance heating vacuum deposition method, an electron-beam heating vacuum deposition method, a RF induced heating vacuum deposition method, a deposition polymerization method, a plasma deposition method, an MBE (Molecular Beam Epitaxial) method, a cluster ion beam method, an ion plating method, a plasma polymerization method (RF excited ion plating method), a sputtering method, and a reactive sputtering method. Specific examples of the chemical vapor deposition method include a plasma CVD method, a thermal CVD method, and a gas source CVD method.

It is more preferable that the anti-vibration portions 15 are formed of metal or inorganic material not transmitting moisture or a dampproof material having a water absorbing ratio of 0.1% or less. The dampproof material having a water absorbing ratio of 0.1% or less can provide performance almost similar to the metal or inorganic material and serves as a water barrier layer for the piezoelectric body 5.

The piezoelectric body 5 is generally made of a piezoelectric ceramic material, which may cause deterioration of a material such as a decrease in Young's modulus due to the permeation of moisture from minute defects under the high-humidity environment.

The piezoelectric inactive region 11 is made of a piezoelectric material. Accordingly, when it is exposed to the high-humidity environment for a long time or a voltage is applied thereto under the high-humidity environment, the deterioration of the material goes ahead and cracks occur due to the stress resulting from the deformation, thereby not securing the long-term reliability. Specifically, the lead-based piezoelectric ceramics represented by the PZT has various excellent characteristics such as a high piezoelectric characteristic, but lead electrochemically reacts with moisture, thereby deforming the material characteristics.

With such a thickness and quality not to cause physical defects such as pinholes, metal as the material of the anti-vibration portions 15 can prevent the transmission of moisture. Examples of the dampproof material having a water absorbing ratio of 0.1% or less include inorganic amorphous materials such as soda glass, white board glass, blue board glass, quartz glass, amorphous carbon, and amorphous silicon, inorganic oxides such as aluminum oxide, magnesium oxide, and germanium oxide, and nitrides such as boron nitride, silicon nitride, and aluminum nitride.

An organic material has a water absorbing ratio of 0.1% or less.

Here, the "water absorbing ratio" is determined in accordance with ASTMD570-81 (24 h test). Specific examples thereof include polymer organic materials such as polyethylene (with a water absorbing ratio of 0.015% or less), polypropylene (with a water absorbing ratio of 0.01% or less), polytetrafluoro ethylene (with a water absorbing ratio of 0.00%), polychlorotrifluoro ethylene (with a water absorbing ratio of 0.00%), and polyparaxylene).

The piezoelectric element according to Modified Example 5 shown in FIG. 9 was manufactured by the same manufacturing method as described in the first embodiment and was compared with the conventional technologies. In the piezoelectric element according to Modified Example 5, when the upper electrode 6 is patterned using Pt, the upper electrode 6 and the anti-vibration portions 15 were formed concurrently of the same material. In this way, 400 piezoelectric elements were manufactured. The piezoelectric elements included an elliptical upper electrode of which the major axis is 1.2 mm and the minor axis is 0.15 mm.

A rectangular waveform voltage having a frequency of 20 kHz and a variable amplitude of 0 V to 40 V was applied to the upper electrode 6 and the lower electrode 4 for 10 days. As the test result, the appearance of 400 piezoelectric elements was not changed and no crack was generated in the piezoelectric bodies 5. Thereafter, by applying a DC voltage of 35V, leak current was checked. In all the elements, the leak current was $5 \times 10^{-7}$ (A/cm$^2$), which means that there is no leak.

Figure 10:
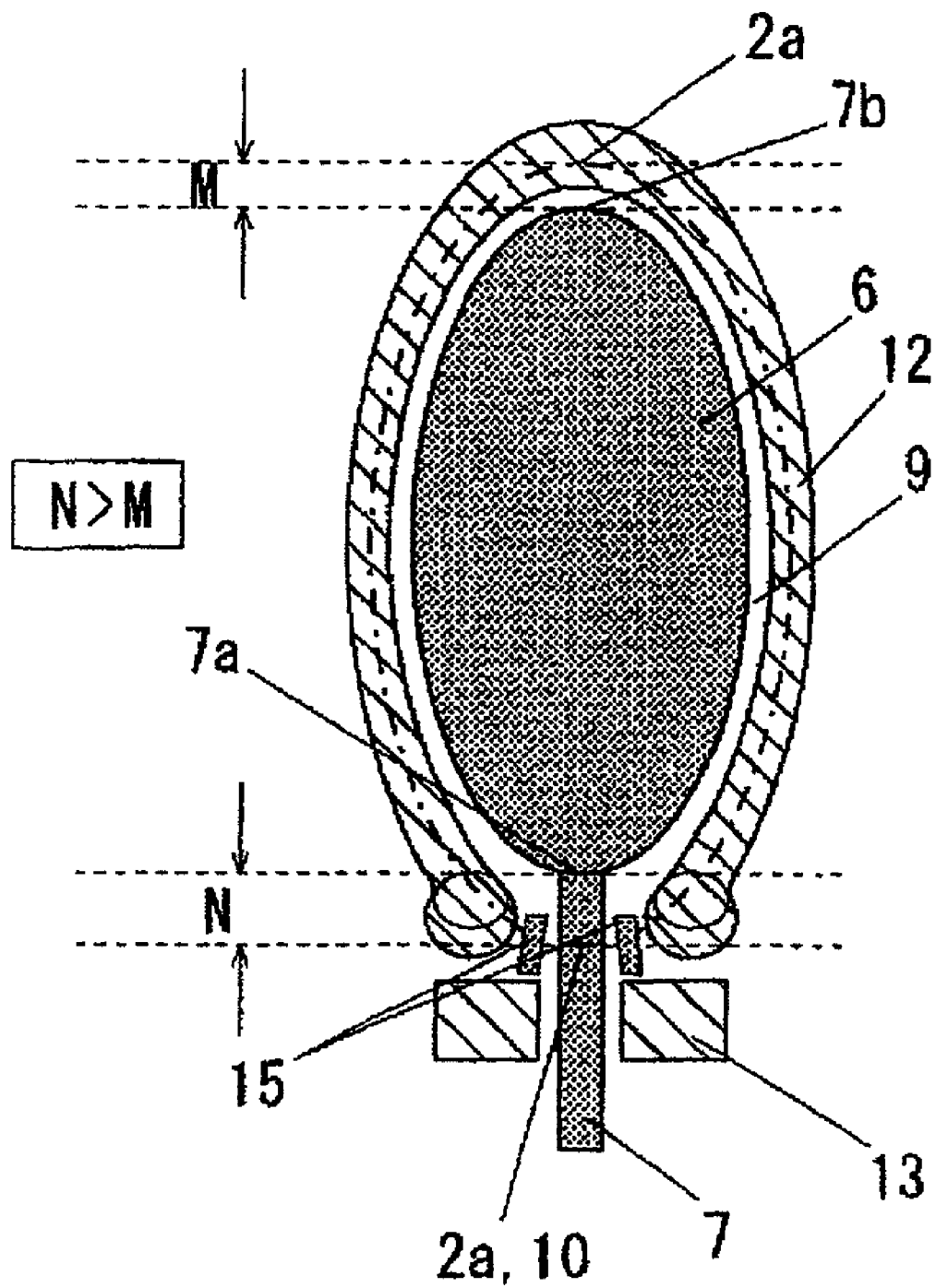
FIG. 10 is a plan view illustrating a piezoelectric element according to Modified Example 6 of the first embodiment of the invention.

FIG. 10 is a sectional view illustrating a piezoelectric element according to Modified Example 6 of the first embodiment of the invention.

In the piezoelectric element according to Modified Example 6, a horizontal distance N from a lead-electrode connection point 7a of the upper electrode 6 to the edge portion 2a (vibration restricting region 10) of the opening is greater than a horizontal distance M from the end 7b opposite to the lead-electrode connection point 7a of the upper electrode 6 to the edge portion 2a opposite to the vibration restricting region 10.

That is, in Modified Example 6, when it is assumed that a horizontal distance from an end (the lead-electrode connection point 7a) of the upper electrode 6 to the edge portion 2a of the opening in the direction in which the lead electrode 7 is drawn out is N and a horizontal distance from an end of the upper electrode 6 to the edge portion 2a of the opening in the direction opposite to the direction in which the lead electrode 7 is drawn out, the relation of N>M is satisfied.

In general, in order to effectively transmit the pressure resulting from the bending deformation occurring at the time of driving to the pressure chamber 2, it is preferable that the piezoelectric active region 9 covered with the upper electrode 6 has an area as large as possible in the plane area on the pressure chamber 2. Accordingly, by forming the patterns of the upper electrode 6 from the boundary (the edge portion 2a of the opening) between the pressure chamber 2 and the peripheral wall 2b toward the entire circumference with a constant interval therebetween, it is possible to maximize the pressure generated in the pressure chamber 2 and to uniformize the pressure distribution or resonance.

On the other hand, since the bending stress due to the deformation of the piezoelectric active region 9 is concentrated on the vibration restriction region 10, the uniform pressure distribution is not consistent with the maximization of the pressure which can be obtained from the piezoelectric active region 9. In the piezoelectric element according to Modified Example 7, the durability is enhanced without decreasing the total pressure generated from the piezoelectric active region 9 as much as possible.

That is, by setting the horizontal distance N between the vibration restriction region 10 and the lead-electrode connection point 7a to be greater than the horizontal distance M between the end 7b of the upper electrode 6 opposite to the lead-electrode connection point 7a and the edge portion 2a opposite to the vibration restriction region 10, the bending stress due to the deformation of the piezoelectric active region 9 is smoothly applied to the vibration restriction region 10. Since the lead electrode 7 having a small width is drawn out but the decrease in driving area of the piezoelectric active region 9, the decrease in pressure generated in the piezoelectric active region 9 is suppressed to be very small. By reducing the stress of the vibrating restriction region 10, the cracks and the like are prevented and the durability is improved.

Figure 11A:
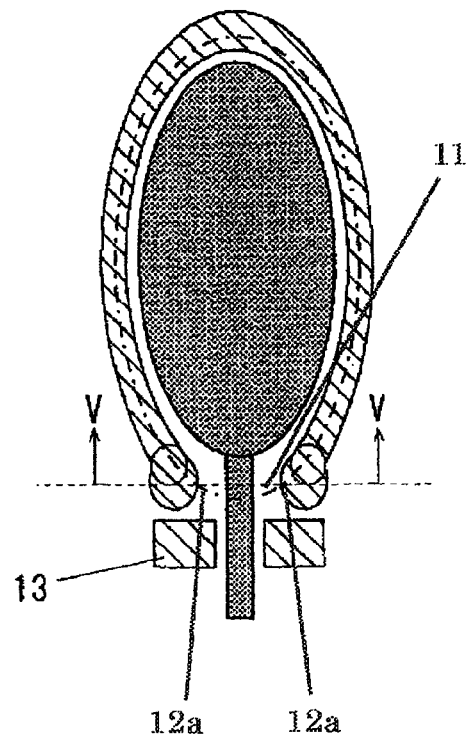
FIG. 11(a) is a plan view illustrating a piezoelectric element according to Modified Example 7 of the first embodiment of the invention and FIG. 11(b) is a sectional view of Modified Example 7.
Figure 11B:
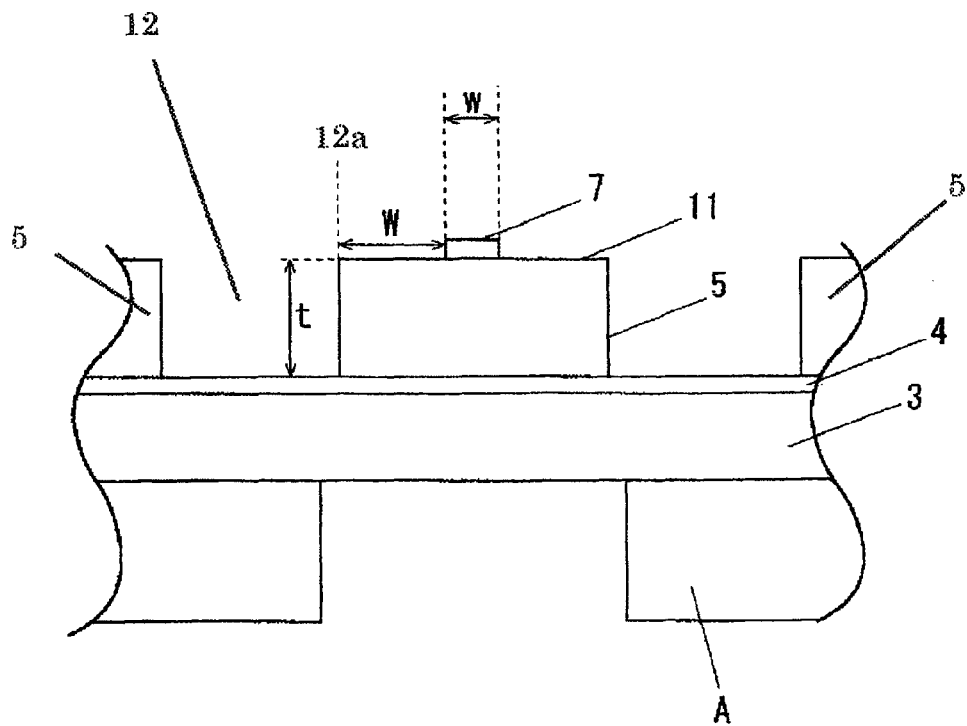

FIG. 11(*a*) is a plan view illustrating a piezoelectric element according to Modified Example 7 of the first embodiment of the invention and FIG. 11(*b*) is a sectional view taken along Line V-V of FIG. 11(*a*).

The position of line V-V in FIG. 11(*b*) is a position at which the width of the piezoelectric inactive region 11 interposed between the end portions 12a of the ring-shaped groove portion 12 is the smallest.

In Modified Example 7, when it is assumed that the thickness (film thickness) of the piezoelectric body 5 is t and the shortest distance in the piezoelectric inactive region 11 from an end in the width direction of the lead electrode 7 to (the end portion 12a of) the ring-shaped groove portion 12 is W, the relation of W>2t is satisfied.

The portion in the piezoelectric inactive region 11 from an end in the width direction of the lead electrode 7 to the side wall of the groove portion 12 is the weakest portion in the piezoelectric inactive region 11, when the lead electrode 7 vibrates and stress is generated. One reason for the cracks or the dielectric breakdown of the piezoelectric inactive portion 11, it was confirmed, is that the piezoelectric inactive region 11 is influenced by the electric field leaking in the width direction of the lead electrode 7 when a voltage is applied across the upper electrode 6 and the lower electrode 4, but the influence depends on the thickness t of the piezoelectric body 5.

Like Modified Example 7, by forming the piezoelectric inactive region 11 to satisfy W>2t, the stress of the piezoelectric inactive region 11 is reduced to prevent the cracks and to enhance the durability. In Modified Example 7, the shortest distances W on both sides of the lead electrode 7 are equal to each other. However, when they are equal, the smaller is the shortest distance W. The stress reducing effect is enough in the range of W>2t, but it is possible to obtain further satisfactory results by setting W>3t.

As shown in FIG. 11, when it is assumed that the width of the lead electrode 7 (here means the width in the vibration restricting region 10, although the width of the lead electrode is constant over the entire length in Modified Example 7) is w, (2W+w)≧3t may be set.

In the area up to the vibration restricting region 10 (edge portion 2a), a voltage is applied across the lead electrode 7 and the lower electrode 4 and stress is generated in the piezoelectric inactive region 11 due to the bending of the piezoelectric body 5. In this way, by setting (2W+w)≧3t, the stress generated in the piezoelectric inactive region 11 with the voltage applied to the lead electrode 7 is reduced, thereby preventing the cracks and the like and enhancing the durability.

Figure 12:
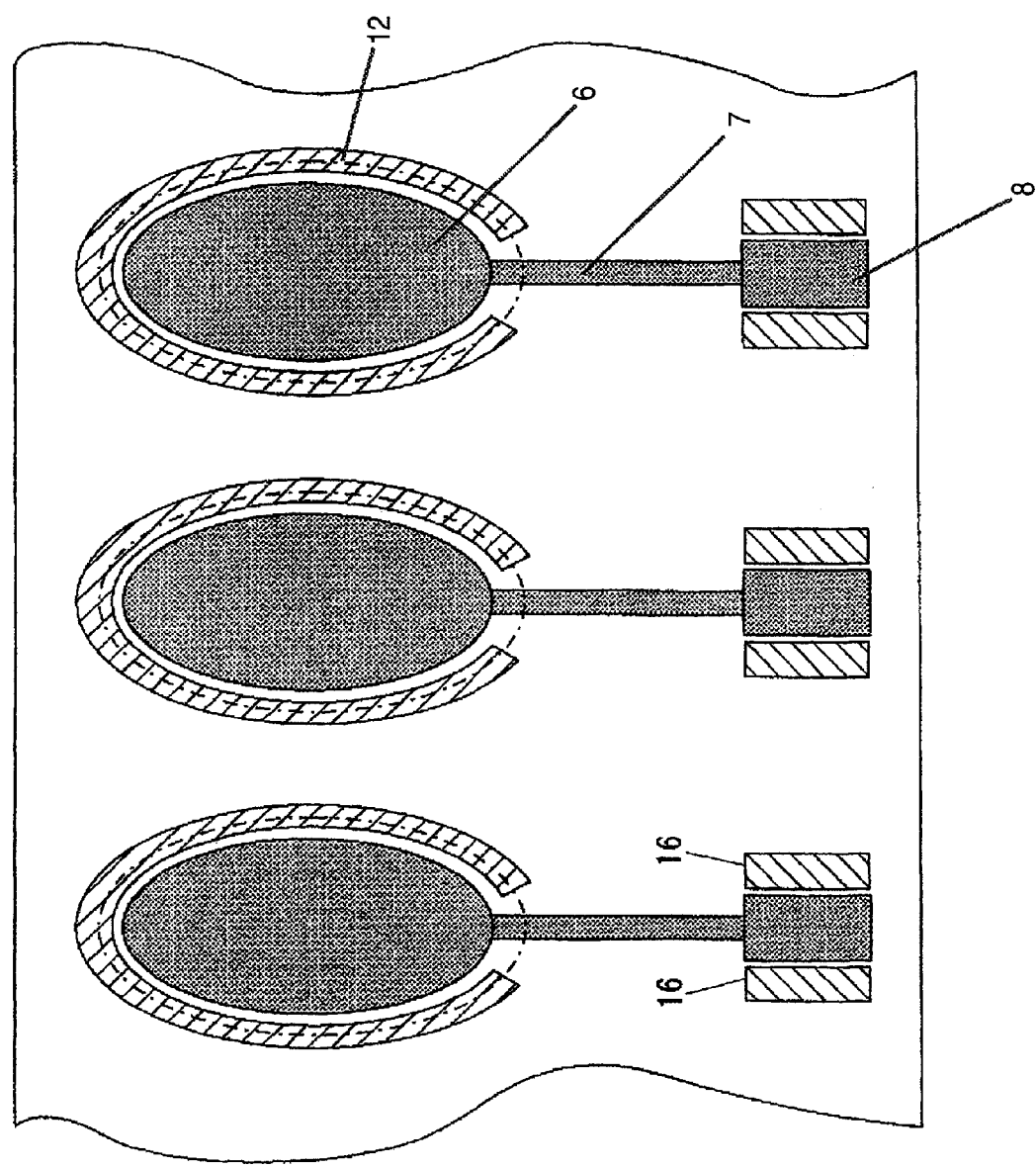
FIG. 12 is a plan view illustrating the piezoelectric element according to the first embodiment of the invention including a wiring portion.

FIG. 12 is a plan view illustrating the piezoelectric element according to the first embodiment of the invention including a wiring portion.

In the first embodiment, the pad portion 8 on which an FPC (Flexible Printed Circuit) board not shown is mounted is formed at an end of the lead electrode 7 as a wiring portion drawn from the upper electrode 6, and holes 16 as concave portions formed by removing the piezoelectric body 5 are formed on both sides of the pad portion 8.

The holes 16 are formed to have such a depth that it reaches the lower electrode 4 (see FIG. 2), similarly to the above-mentioned groove portion 12.

When the FPC board is bonded to the pad portion 8, the FPC board is heated and then pressed on the pad portion 8. Cracks and the like may be generated in the piezoelectric body 5 at the time of pressing. When cracks and the like are generated in the piezoelectric body 5, a problem with a short-circuit or an open in the mounting portion occurs. By removing the piezoelectric body 5 from both sides of the pad portion 8, the stress of the piezoelectric body 5 around the pad portion 8 is released, thereby preventing the cracks from being generated at the time of pressing.

When a crack is generated between two pad portions 8, a cross crack reaching the pad portion 8 is prevented from being generated due to the removal of the piezoelectric body 5, thereby enhancing the yield at the time of mounting the FPC board. Although it has been described in the first embodiment that only the piezoelectric body on both sides of the pad portions 8 is removed, the piezoelectric body 5 may be removed in a "⊃" shape along the edge of the pad portion 8. Alternatively, the area from which the piezoelectric body 5 is removed may be enlarged along both sides of the lead electrode 7 connected to the pad portion 8.

Figure 13:
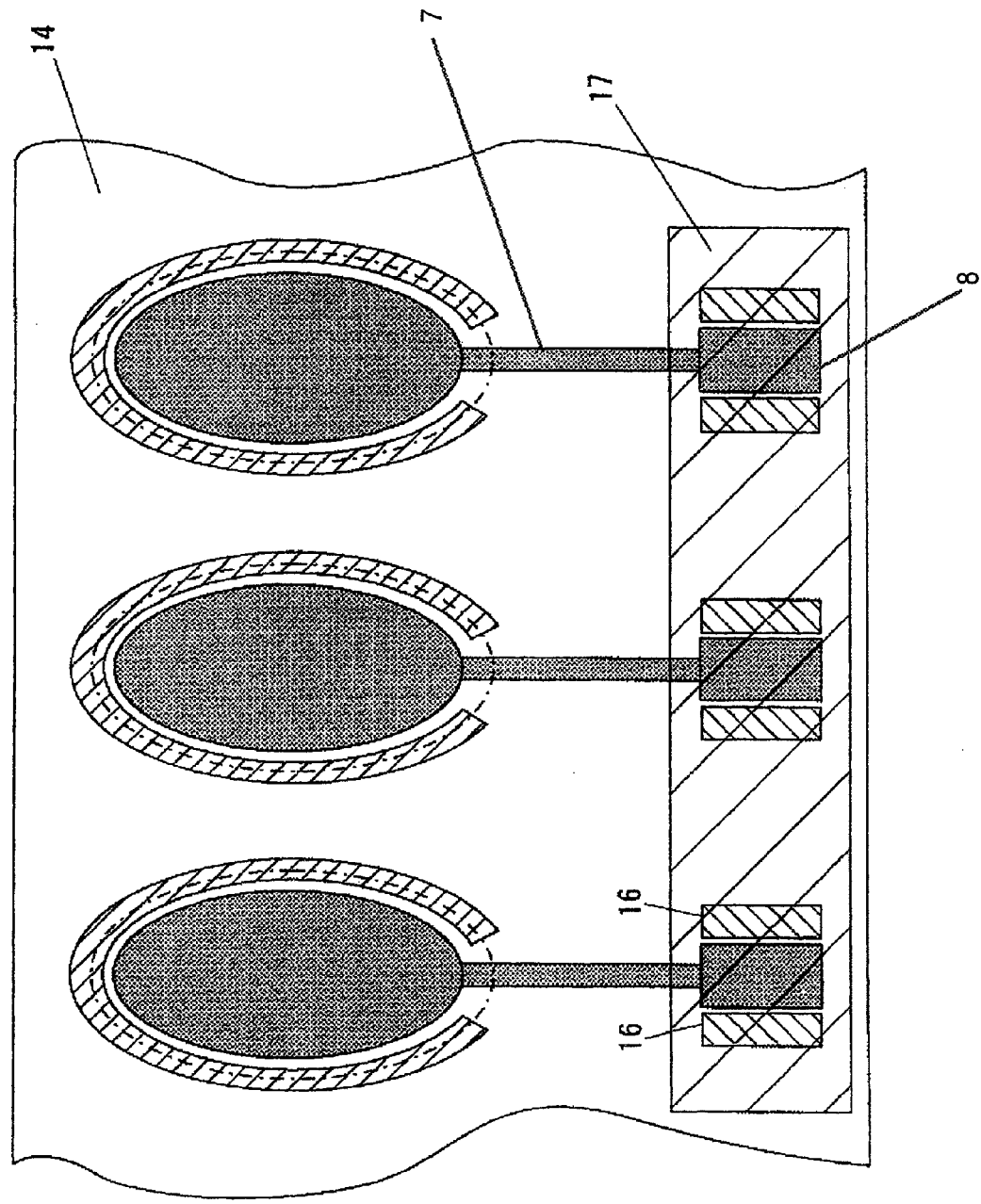
FIG. 13 is a diagram illustrating a case where an FPC is mounted on the piezoelectric element according to the first embodiment of the invention.

FIG. 13 is a diagram illustrating a case where the FPC is mounted on the piezoelectric element according to the first embodiment of the invention. When the FPC board is bonded to the pad portion 8, an anisotropic conductive film (ACF) 17 is attached to the pad portion 8 and the piezoelectric body 5, and the FPC board is aligned with the pattern of the pad portion 8 and then heated and pressed. Specifically, The FPC board is heated to 150° C. to 200° C. and a pressing load of 3.3 MPa is applied to the FPC board with a silicon sheet therebetween, thereby performing the bonding.

As shown in FIG. 13, in the first embodiment, the attachment area of the ACF 17 is set to be smaller than the forming area of the insulator layer 14. When foreign particles get bitten in the portion where a lead wire portion of the FPC board protrudes from the pad portion 8 to the piezoelectric body 5, cracks and the like may be very easily generated in the piezoelectric body 5 at the time of pressing the FPC board.

In the state where the foreign particles get bitten in, when the anisotropic conductive resin formed on the ACF 17 is pushed into the piezoelectric body 5 or the foreign particles are conductive materials such as metal, insulation failure occurs between the lead wire portion of the FPC board and the lower electrode, thereby causing leak current. Even when the foreign particles get bitten, by setting the attachment area of the ACF 17 to be smaller than the forming area of the insulator layer 14, the insulation between the lead wire portion of the FPC board and the lower electrode can be maintained, thereby enhancing the yield of the products and thus securing the reliability.

The first embodiment, Modified Examples 1 to 7, the configuration of the wiring portion, and the configuration for mounting the FPC can be properly put into practiced in various forms.

Figure 21:
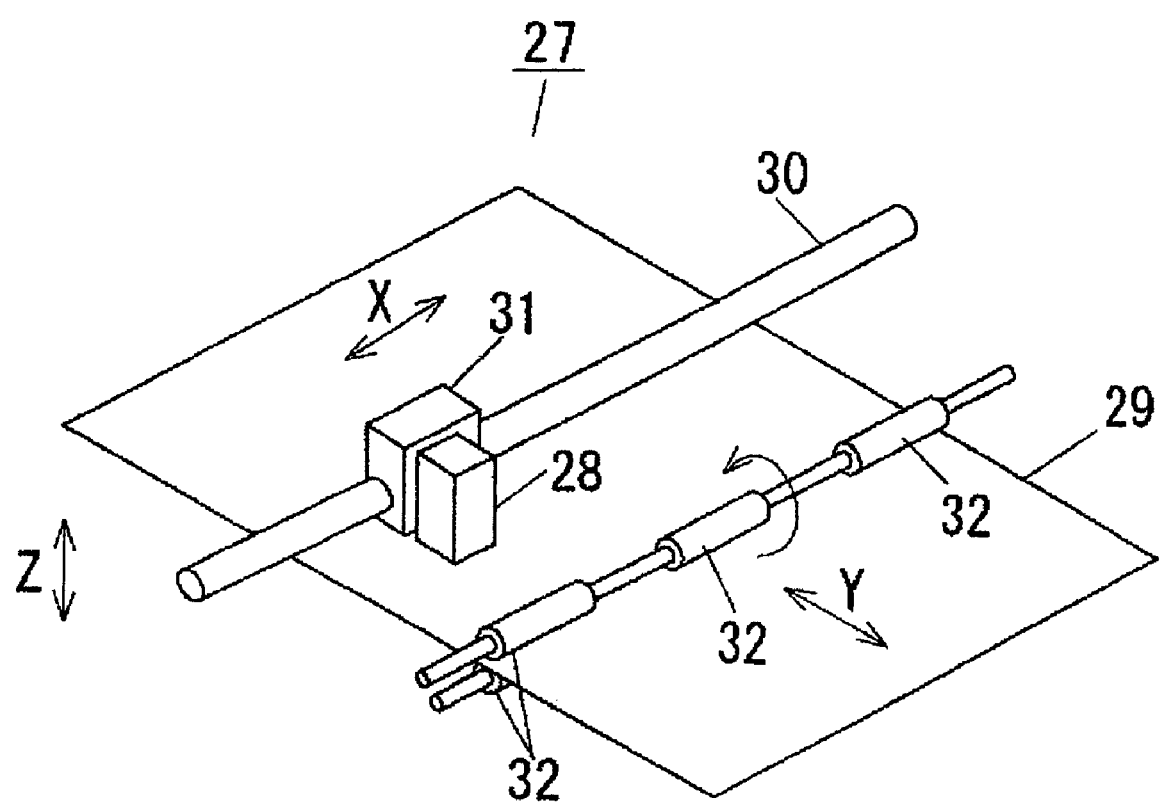
FIG. 21 is a perspective view illustrating an ink jet recording device mounted with the piezoelectric element according to the first embodiment of the invention.

FIG. 21 is a perspective view illustrating an ink jet recording device mounted with the piezoelectric element according to the first embodiment of the invention.

The ink jet recording device 27 has plural ink jet heads 28 shown in FIG. 18. A recording operation is performed by ejecting ink in the pressure chamber to a recording medium (recording sheet and the like) 29 from nozzles communicating with the pressure chambers of the ink jet heads 28.

The ink jet heads 28 are mounted on a carriage 31 suspended on a carriage shaft 30 extending in the main scanning direction X and reciprocate in the main scanning direction X with the reciprocation of the carriage 31 along the carriage shaft 30. The carriage 31 constitutes moving means for moving the ink jet heads 28 and the recording medium 29 in the main scanning direction X relative to each other.

The ink jet recording device 27 has plural rollers 32 for moving the recording medium 29 in the sub scanning direction Y perpendicular to the main scanning direction X (width direction) of the ink jet heads 28. The plural rollers 32 constitute moving means for moving the ink jet heads 28 and the recording medium 29 in the sub scanning direction relative to each other. In FIG. 21, reference sign Z denotes a vertical direction.

When the ink jet heads 28 are being moved in the main scanning direction X with the movement of the carriage 31, ink is ejected onto the recording medium 29 from the nozzles of the ink jet heads 28. When one scan of recording operation in the main scanning direction X is finished, the recording medium 29 is moved in the sub scanning direction Y by a predetermined distance by the use of the rollers 32 and another scan of recording operation in the main scanning direction X is performed.

The ink jet recording device 27 employing the piezoelectric element according to the first embodiment has excellent printing performance and durability.

As described above in detail, the piezoelectric element according to the first embodiment includes: a pressure chamber member that has an opening communicating with a nozzle; a vibrating plate that is disposed on the pressure chamber member so as to cover the opening; a lower electrode that is disposed on the vibrating plate; a piezoelectric body that is disposed on the lower electrode; an upper electrode that is disposed on the piezoelectric body and in a region opposed to the opening; and a lead electrode that is disposed on the piezoelectric body, that extends from the upper electrode, and that has a width smaller than that of the upper electrode. Here, the piezoelectric body includes: a groove portion that is disposed in a predetermined region along an edge portion of the opening; and an inactive region that is a region other than the groove portion, that is disposed along the edge portion of the opening, and that does not substantially serve as a piezoelectric element, wherein the lead electrode is disposed in the inactive region.

According to this configuration, it is possible to reduce the stress on the lead electrode extending over the vibration restriction region (edge portion of the pressure chamber hole) and thus to prevent damage such as cracks.

In addition, the piezoelectric element according to the first embodiment includes: a pressure chamber member that has an opening communicating with a nozzle; a vibrating plate that is disposed on the pressure chamber member so as to cover the opening; a lower electrode that is disposed on the vibrating plate; a piezoelectric body that is disposed on the lower electrode; an upper electrode that is disposed on the piezoelectric body and in a region opposed to the opening; and a lead electrode that is disposed on the piezoelectric body, that extends from the upper electrode over an edge portion of the opening, and that has a width smaller than that of the upper electrode. Here, a groove portion is formed in a region of the piezoelectric body along the edge portion of the opening other than the vicinity of a region where the lead electrode extends over the edge portion of the opening, wherein an end of the groove portion close to the lead electrode is formed in such a curved shape that a portion facing the lead electrode is convex.

According to this configuration, it is possible to reduce the stress on the lead electrode extending over the vibration restriction region (edge portion of the pressure chamber hole) and thus to prevent damage such as cracks.

In the piezoelectric element according to the first embodiment, the groove portion is formed in a region overlapping with the edge portion of the opening at least with such a depth that the groove portion reaches the surface of the lower electrode.

According to this configuration, it is possible to increase the density of the piezoelectric elements, to enhance the deformation efficiency of the vibrating plate with the driving of the piezoelectric element, and to reduce the stress due to the vibration of the piezoelectric vibration in the vicinity of the vibration restricting region (edge portion of the pressure chamber hole), thereby preventing the damage due to the cracks and the like of the piezoelectric element.

In the piezoelectric element according to the first embodiment, the edge portion of the opening substantially forms an elliptical shape.

According to this configuration, the shape of the piezoelectric active region substantially serving as a piezoelectric element is substantially elliptical. Accordingly, since this shape has no corner portion, it is possible to prevent the damage of the piezoelectric element due to the concentration of stress.

In the piezoelectric element according to the first embodiment, an end of the groove portion facing the lead electrode is formed in a substantially circular shape with a diameter larger than the width of the groove portion.

According to this configuration, it is possible to reduce the stress on the lead electrode extending over the vibration restriction region (edge portion of the pressure chamber hole) and thus to prevent damage such as cracks.

In the piezoelectric element according to the first embodiment, a concave portion formed by removing the piezoelectric body is disposed on a side of the lead electrode extending from the upper electrode.

According to this configuration, with the high-density arrangement of the piezoelectric elements, the stress existing in the piezoelectric inactive region is released and the vibration in the vicinity of the vibration restriction region is suppressed, thereby preventing the damage such as cracks.

In the piezoelectric element according to the first embodiment, the groove portion and the concave portion are allowed to communicate with each other.

According to this configuration, the vibration in the vicinity of the vibration restriction region is further suppressed, thereby preventing the damage such as cracks.

In the piezoelectric element according to the first embodiment, an insulator layer is disposed outside the region opposed to the opening and between the upper electrode and the piezoelectric body or between the piezoelectric body and the lower electrode.

According to this configuration, since the stepped portion formed at the boundary of the area in which the insulator layer is stacked is disposed in an area not substantially influenced by the vibration at the time of driving the piezoelectric element, the damage such as cracks starting from the stepped portion does not occur. Since the lead electrode is drawn on the piezoelectric body with the insulator layer interposed therebetween, the insulating property of the lead electrode is secured and the storage capacitance of the lead electrode is reduced, thereby enhancing the reliability and performance of the piezoelectric element.

In the piezoelectric element according to the first embodiment, an anti-vibration portion is disposed between an end of the groove portion and the lead electrode extending from the upper electrode so as to extend over the edge portion of the opening.

According to this configuration, it is possible to suppress the stress of the piezoelectric inactive region in the vicinity of the vibration restricting region.

In the piezoelectric element according to the first embodiment, the anti-vibration portion is formed of a material having Young's modulus higher than that of the piezoelectric body.

According to this configuration, it is possible to enhance the rigidity or strength of the piezoelectric inactive region and to suppress the vibration.

In the piezoelectric element according to the first embodiment, the anti-vibration portion is formed of the same material as the upper electrode.

According to this configuration, since the anti-vibration portion can be formed at the same time as forming the upper electrode in the course of manufacturing the piezoelectric element, the element manufacturing process is simplified.

In the piezoelectric element according to the first embodiment, the anti-vibration portion is formed of a metal or an inorganic material not transmitting moisture, or a dampproof material having a water-absorbing ratio of 0.1% or less.

According to this configuration, it can be prevented that the piezoelectric body of the piezoelectric inactive region is deteriorated due to permeation and adsorption of moisture and the damage such as cracks due to a variation in physical characteristic are easily generated.

In the piezoelectric element according to the first embodiment, the anti-vibration portion is formed by the use of a vapor deposition method.

According to this configuration, it is possible to uniformly form the anti-vibration portion with high precision.

In the piezoelectric element according to the first embodiment, a relation of N>M is satisfied, where N is a horizontal distance from an end of the upper electrode to the edge portion of the opening in a direction in which the lead electrode extends and M is a horizontal distance from an end of the upper electrode to an end of the opening in a direction opposite to the direction in which the lead electrode extends.

According to this configuration, it is possible to reduce the stress on the vibration restricting region without decreasing the deformation efficiency of the vibration plate with the driving of the piezoelectric element.

In the piezoelectric element according to the first embodiment, a relation of W>2t is satisfied, where t is a thickness of the piezoelectric body and w is the shortest distance between the lead electrode disposed on the piezoelectric body and the groove portion.

According to this configuration, the piezoelectric inactive region effectively performs its function, thereby reducing the stress on the vibration restriction region.

In the piezoelectric element according to the first embodiment, a relation of (2W+w)≧3t is satisfied, where w is a width of the lead electrode extending over the edge portion.

According to this configuration, since the width of the lead electrode is a width enough to allow the piezoelectric inactive region to effectively perform its function and it is possible to allow the increase in density of the piezoelectric elements to be consistent with the reduction in stress on the vibration restriction region.

In the piezoelectric element according to the first embodiment, a surface-mounting pad portion is formed at the end of the lead electrode extending from the upper electrode, and a concave portion formed by removing the piezoelectric body is disposed on a side of the pad portion.

According to this configuration, since the internal stress is released by the removal of the piezoelectric body and the piezoelectric body layer is made to be discontinuous between the adjacent pad portions, it is possible to prevent the cracks of the piezoelectric body layer, particularly, the cracks crossing the pad portion, due to the pressing at the time of mounting the FPC.

The piezoelectric element according to the first embodiment further includes a conductive member serving both as the vibrating plate and the lower electrode, wherein the groove portion is formed in a region overlapping with the edge portion of the opening with such a depth that the groove portion reaches the surface of the conductive member.

According to this configuration, it is possible to enhance the deformation efficiency of the conductive member serving both as the vibrating plate and the lower electrode with the driving of the piezoelectric element, to reduce the stress due to the vibration of the piezoelectric body in the vicinity of the vibration restricting region (edge portion of the pressure chamber hole), and to prevent the damage such as cracks of the piezoelectric body.

Since the ink jet head having the piezoelectric element according to the first embodiment has excellent durability, it is possible to secure long-term reliability.

The ink jet recording device having the piezoelectric element according to the first embodiment has high performance and excellent reliability.

Second Embodiment

Hereinafter, a second embodiment of the invention will be described in detail.

It is possible to further enhance the reliability of the piezoelectric element by applying the second embodiment to the piezoelectric element according to the first embodiment.

When a high voltage is applied to the piezoelectric element in a state where it is exposed to a high-humidity atmosphere for a long time, an electrical insulation property of the piezoelectric body is deteriorated, thereby causing the dielectric breakdown. Accordingly, various studies for preventing the dielectric breakdown have been made.

As one countermeasure, in order to prevent migration of an electrode material into the piezoelectric body which is greatly associated with the dielectric breakdown, gold or platinum that hardly migrates is used as the electrode material. However, even when the migration of the electrode material to the piezoelectric body is prevented using gold or platinum as the electrode material, the electrical insulation property of the piezoelectric body is deteriorated. Accordingly, it was seen that the main reason for deterioration in electrical insulation is because of moisture that directly acts on the piezoelectric body.

Therefore, in order to prevent the moisture from acting directly on the piezoelectric body, for example, JP-A-04-349675 suggested a method of receiving the entire piezoelectric element in a metal airtight container and putting a drying agent therein to hermetically seal the inside. For example, JP-A-10-305578 suggested a method of sealing a piezoelectric element with a cap member and enclosing a drying fluid, an inert gas, or a fluid low in steam pressure in the airtight space. For example, JP-A-2004-322605 suggested a method of introducing a drying gas at a constant flow rate to keep a dew-point environment at a temperature of −50° C. or less so as to keep the vicinity of the piezoelectric element under the low-humidity environment.

In recent years, with a decrease in size of electronic devices, a decrease in size is also strongly necessary for a piezoelectric element. In order to meet the requirement, a piezoelectric element is used in the form of a piezoelectric body much smaller in volume than a sintered body having been used much. Such a piezoelectric body is formed by the use of a physical vapor deposition method (PVD) such as a sputtering method, a chemical vapor deposition method (CVD), or a sol-gel method. The decrease in size and the increase in density are intended by using a fine processing technology such as photolithography or dry etching.

For the purpose of decreasing the size, it is required that the piezoelectric element should be used in an exposed state where it is not received in a metal airtight container. However, lead-based piezoelectric ceramics represented by PZT has the following features.

That is, since Pb (lead) can easily go out in the form of PbO (lead oxide) at the time of forming a film by the use of a baking method, a sintering method, or a sputtering method, it is difficult to control the lead-based piezoelectric ceramics represented by PZT by the use of the stoichiometric composition. When the lead is smaller than the stoichiometric composition, deterioration in orientation characteristic, piezoelectric characteristic, ferroelectric characteristic, and pyroelectric characteristic is caused. Accordingly, the lead is often added slightly more excessively than the stoichiometric composition. For example, the piezoelectric substance including lead compound such as PZT is synthesized at a high temperature.

The PZT has a stoichiometric composition of $Pb(Zr_{1-x}, Ti_x)O_3$ (0<x<1) and a stoichiometric composition ratio of Pb:Zr+Ti:O=1:1:3. Since the steam pressure of the lead is high at a high temperature, it is general that the lead is slightly more excessive than the stoichiometric composition of PZT in consideration of manufacturing stability (for example, see JP-A-2000-244174).

The piezoelectric element using the piezoelectric body excessive in lead is used without being received in a metal airtight contained and may cause the dielectric breakdown with an application of a high voltage under the high-humidity condition.

The dielectric breakdown causes a problem when the piezoelectric body is formed in a thin film, that is, in a piezoelectric thin film. Here, the piezoelectric thin film means a piezoelectric body formed with a thickness of 0.5 to 10 μm.

Now, a mechanism of the dielectric breakdown will be described.

For example, in a piezoelectric thin film manufactured by the use of a sputtering method, particles are often aggregates of plural column-shaped crystals growing continuously from an end in the thickness direction to the other end in a column shape and boundaries between the column-shaped particles exist as grain boundaries which serve as leak paths. Even piezoelectric thin films not showing the shape of aggregates of column-shaped crystals have many grain boundaries. Small voids exist in the thickness direction by the influence of foreign particles at the time of forming a thin film. Excessive lead exists in the form of oxide at the grain boundaries or on the surfaces of voids of the piezoelectric thin film. Accordingly, when the piezoelectric thin film is exposed to moisture, the lead compound existing on the grain boundaries or the void surfaces reacts with the moisture to cause an electrochemical reaction with the absorbed moisture, thereby being reformed.

That is, when the piezoelectric thin-film element having the piezoelectric thin film is used under the high-humidity environment without being received in an airtight container, the moisture passes through pinholes and permeates the grain boundaries of the piezoelectric thin film. Lead oxide existing in the grain boundaries electrochemically reacts with the permeated moisture into lead hydroxide and is reformed into lead dioxide having electrical conductivity, thereby causing the dielectric breakdown.

From the viewpoint of mechanism of causing the dielectric breakdown, the attack of moisture on the piezoelectric material including lead compound such as PZT can be removed. Accordingly, a study for preventing deterioration of the piezoelectric material even in used under the high-humidity environment without being received in the airtight container by constructing such a countermeasure has been made (for example, see JP-A-2000-043259 and JP-A-10-242539).

That is, JP-A-2000-043259 suggested a method of disposing a heating film adjacent to the piezoelectric thin film of the piezoelectric thin-film element and actively heating the piezoelectric thin film by the use of the heating film to prevent absorption of moisture in the piezoelectric thin film. JP-A-10-242539 suggested a countermeasure for preventing the permeation of the steam or dew-formed water component in the air in which the piezoelectric thin-film element is coated with an inorganic material such as SiN (silicon nitride) or resin such as polyparaxylene or derivatives thereof having a high gas barrier property.

The method of sealing a piezoelectric thin-film element which has been suggested by JP-A-04-349675 and JP-A-10-305578 has the following problems. That is, when a leak path to an external environment exists at the time of sealing, the internal humidity environment varies just after the sealing. Accordingly, it is necessary to shield the piezoelectric thin-film element from the external environment by attaching a sealing member such as cap member to the piezoelectric thin-film element with an adhesive, but it is not easy to check the leak path. Since it is expected that the internal environment varies with the lapse of time due to the moisture permeated through the boundary of the adhesive from the outside or from the adhesive itself after the sealing, the sealing work should be carried out under the low-humidity environment with very small moisture. In case of mass production at a factory, time is required, thereby increasing the manufacturing cost. In addition, since the element lifetime cannot be predicted due to destruction resulting from the moisture with the variation in humidity in the vicinity of the piezoelectric thin-film element after the sealing, the term of guarantee of the product cannot be established.

The method of introducing a dry gas from the outside to control the dew-point environment in the vicinity of the piezoelectric thin-film element, which was disclosed in JP-A-2004-322605, is effective for the problems with the non-uniformity of the element due to the sealing and the temporal variation in humidity, thereby providing a stable humidity environment. However, in order to realize the humidity environment with a dew point of −50° C. or less which is necessary in JP-A-2004-322605, as can be seen from the description that subsidiary facilities such as an air filter or an oil mist filter is required, the ability of the air drier should be considerably great. Since the dew point of −50° C. or less should be maintained at any constant flow rate, the load or cost for the system is great.

In the method of forming a protective film having a high gas barrier property to prevent the permeation of the steam or the dew-formed water component in the air which is disclosed in JP-A-10-242539, it is difficult to completely cover the surface defects of the piezoelectric thin-film element with a thin film not hindering the mechanical deformation of the piezoelectric thin-film element. When plural piezoelectric thin-film elements are arranged in parallel like an ink jet head, the elements should be controlled independently of each other. Accordingly, a film having a high insulating property is necessary as the protective films formed on the piezoelectric thin-film elements. In general, a resin or an inorganic material is used for the protective film but a certain thickness is necessary to maintain the gas barrier property, thereby hindering the mechanical deformation of the piezoelectric thin film element. In addition, in the high-humidity environment, since moisture is permeated through the boundaries between the piezoelectric thin-film elements and the protective films and the deterioration and peeling occur with the lapse of time, it is necessary to maintain the close contact between the piezoelectric thin-film element and the protective film. This also causes the hindering of the mechanical deformation of the piezoelectric thin-film element.

According to the second embodiment, it is possible to provide a piezoelectric thin-film element with a low-humidity environment which prevents element breakdown due to moisture.

According to the second embodiment, it is possible to provide a method of aging a piezoelectric thin-film element which can enhance the driving reliability under the high-humidity environment.

The piezoelectric thin-film element according to the second embodiment is a piezoelectric thin-film element including a piezoelectric thin film with a predetermined thickness and electrodes formed on both sides in the thickness direction of the piezoelectric thin film and further includes means for maintaining a dew point of the peripheral atmosphere in the range of −40° C. to 0° C.

According to the second embodiment, the generation of the leak current in the piezoelectric thin-film element due to moisture is suppressed, thereby stably driving the piezoelectric thin-film element. The lifetime of a product is guaranteed by setting the dew point range.

According to the second embodiment, even when the actual driving environment is high in humidity, it is possible to perform a stable driving operation and to guarantee the product lifetime.

Hereinafter, the piezoelectric thin-film element and the method of aging the piezoelectric thin-film element according to the second embodiment will be described in detail with reference to the drawings.

Figure 22:
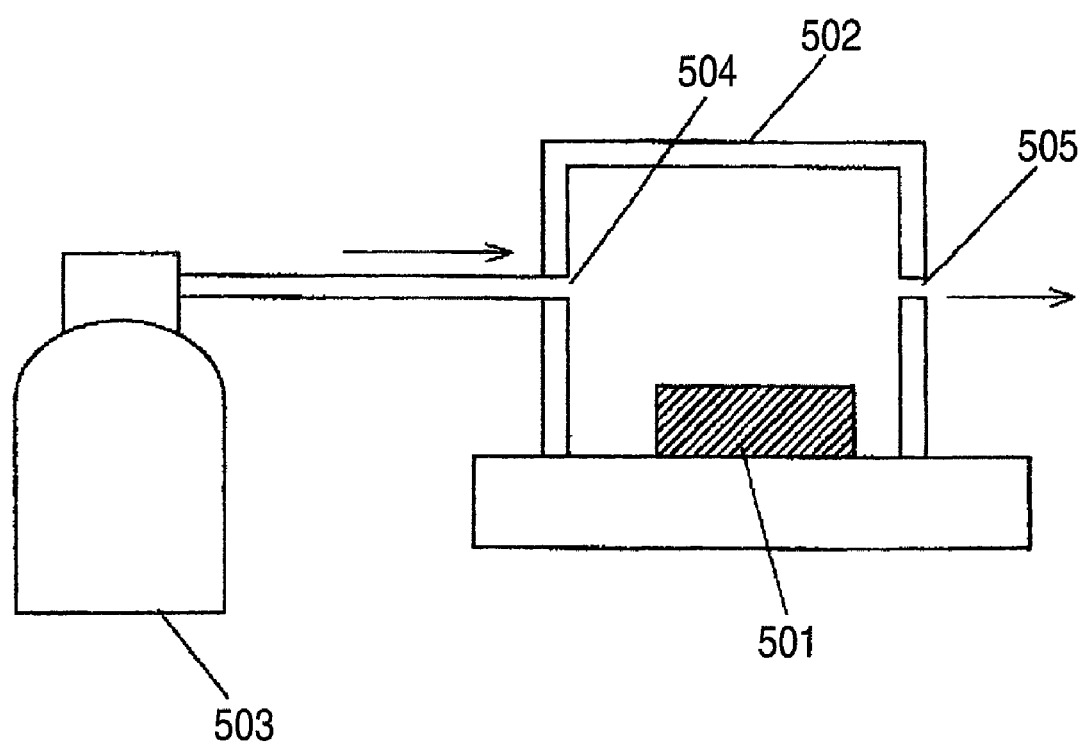
FIG. 22 is a partially sectional view illustrating a configuration of a piezoelectric thin-film element with a low-humidity environment according to a second embodiment of the invention.

FIG. 22 is a partially sectional view illustrating a configuration of the piezoelectric thin-film element with a low-humidity environment according to a second embodiment of the invention. In FIG. 22, a case 502 for receiving a piezoelectric thin-film element 501 includes an introduction port 504 for introducing a dry gas supplied from a dew point controller 503 and a discharge port 505.

The number of piezoelectric thin-film element 501 received in the case 502 may be one. However, even when two or more piezoelectric thin-film elements 501 are received therein, they can be received in a state where a space for not preventing the mechanical deformation thereof is maintained.

Although not shown, a mechanism for applying a driving voltage to both electrode layers of the respective piezoelectric thin-film elements 501 is disposed on a mounting surface of the case 502 on which the piezoelectric thin-film elements 501.

Figure 24:
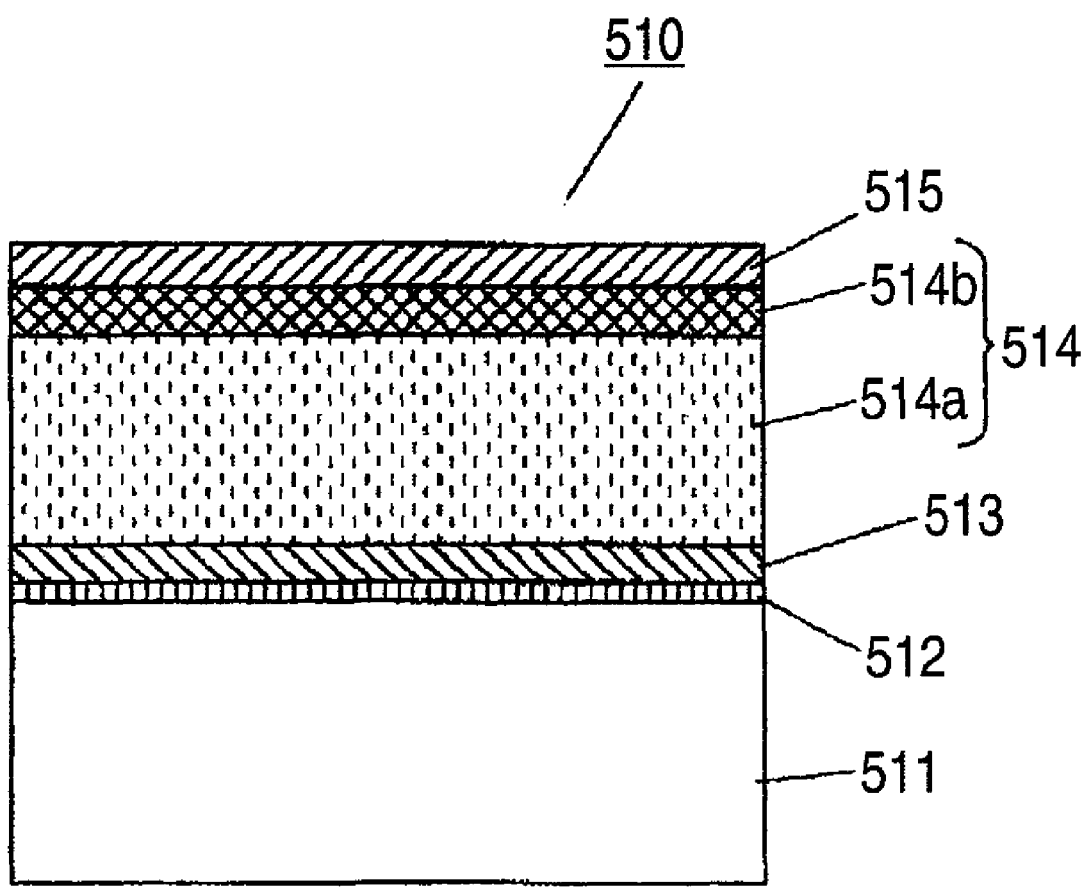
FIG. 24 is a sectional view illustrating a configuration of the piezoelectric thin-film element according to the second embodiment of the invention.

The piezoelectric thin-film element 501 is configured as shown in FIG. 24. The dry gas supplied from the dew point controller 503 is a dry gas of which a dew point is in the range of −40° C. to 0° C. or a low-humidity gas such as nitrogen and argon.

The dew point controller 503 includes an air drier (dry gas generator) for generating a dry gas of which the dew point is in the range of −40° C. to 0° C., a tank in which the dry gas of which the dew point is in the range of −40° C. to 0° C. is enclosed, and a pipe that is disposed as facilities in a building so as to feed the dry gas (nitrogen gas, argon gas, and the like) of which the dew point is in the range of −40° C. to 0° C.

Examples of the air drier include a cooling air drier for removing moisture in the gas by lower the temperature, a filter air drier for removing moisture in the gas by allowing the gas to pass through the filter, and an adsorbing air drier for removing moisture in the air by allowing the gas to pass through an absorbent such as silica gel.

The dry gas generated from the dew point controller 503 is supplied from the introduction port 504 of the case 502, is discharged from the discharge port 505, and thus the internal pressure of the case 502 is higher than the external pressure outside the case. Accordingly, it is possible to stabilize the atmosphere in the vicinity of the piezoelectric thin-film element 501 for a long time, thereby keeping the atmosphere at a low humidity of which the dew point is in the range of −40° C. to 0° C.

Accordingly, since the piezoelectric thin-film element 501 with a low-humidity environment is prevented from the damage due to the moisture, it is possible to stably drive the piezoelectric thin-film element and to guarantee the product lifetime. The dew point of −45° C. can come true at a lower cost than −50° C. The dew point of −40° C. can be realized at a lower cost. Even when the dry gas generated by the dew point controller 503 is sprayed to the vicinity of the piezoelectric thin-film element 501 without providing the case 502, it is possible to obtain the same advantage.

Figure 23:
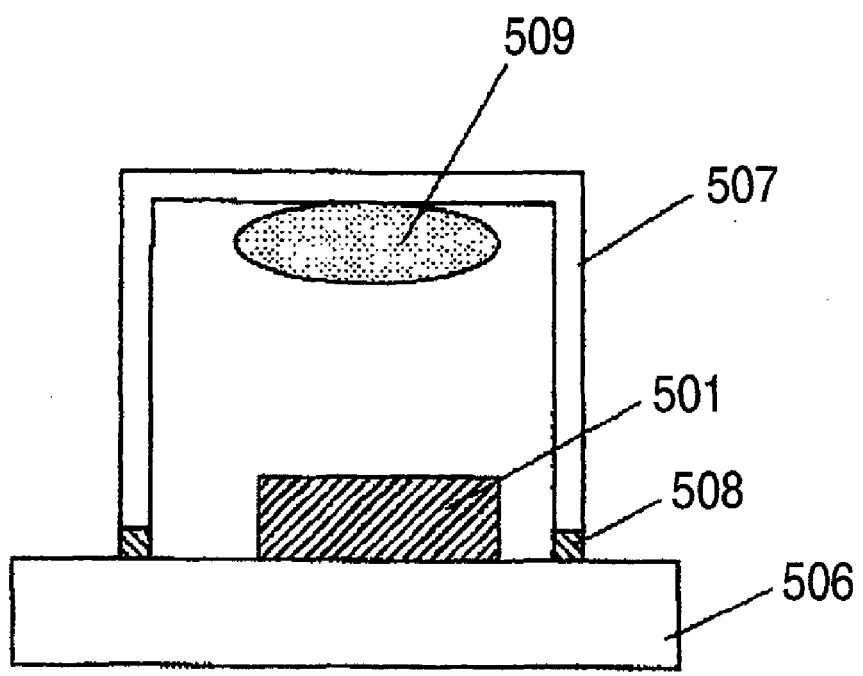
FIG. 23 is a partially sectional view illustrating another configuration of the piezoelectric thin-film element with a low-humidity environment according to the second embodiment of the invention.

FIG. 23 is a partially sectional view illustrating another configuration of the piezoelectric thin-film element with a low-humidity environment according to the second embodiment of the invention.

In FIG. 23, an opening end of a cap member 507 is attached to a base 506 on which the piezoelectric thin-film element 501 is placed with an adhesive 508 and the piezoelectric thin-film element 501 is received in an airtight space in a state where the mechanism deformation thereof is not prevented. By enclosing a drying agent 509 in the airtight space, the low-humidity environment is maintained in which the dew point of the atmosphere in the vicinity of the piezoelectric thin-film element 501 is in the range of −40° C. to 0° C.

Although not shown, a mechanism for applying a driving voltage to both electrode layers of the piezoelectric thin-film element 501 is disposed in the base 506.

Here, the cap member 507 is formed of an inorganic material such as glass and ceramics or metal, which hardly transmit moisture and has an excellent gas barrier property. The base 506 may be formed of the same material as the cap member 507, but may be formed of a part of the substrate of the piezoelectric thin-film element 501.

An epoxy resin or an adhesive sheet which hardly transmits moisture is used as the adhesive 508 between the base 506 and the cap member 507, and metal solder or inorganic adhesive may be used in addition.

Silica gel, calcium chloride, and molecular sieve barium oxide are used as the drying agent 509 enclosed in the airtight space.

Accordingly, after the drying agent 509 is enclosed and the cap member 507 and the base 506 are attached to each other, the moisture in the airtight space is absorbed by the drying agent 509. Therefore, the peripheral space of the piezoelectric thin-film element 501 is maintained in the low-humidity environment of which the dew point is in the range of −40° C. to 0° C.

By properly designing and controlling the material, the attachment area, the attachment thickness of the adhesive 508, the moisture permeated from the outside can be suppressed as small as possible and the permeated moisture is also removed by the drying agent 509. Accordingly, it is possible to maintain the inside in the low-humidity environment for a long term. By maintaining the dew point environment at a low humidity at the time of enclosing the drying agent, it is possible to maintain the inside in the low-humidity environment for a long term.

Accordingly, similarly to the case where the dry air is made to flow around the piezoelectric thin-film element 501, since the damage on the piezoelectric thin-film element 501 due to the moisture is prevented, it is possible to stably drive the piezoelectric thin-film element and to guarantee the product lifetime. It is also possible to realize the dew point of −40° C. with a low-cost configuration.

FIG. 24 is a sectional view illustrating a configuration of the piezoelectric thin-film element according to the second embodiment of the invention.

Hereinafter, the configuration of the piezoelectric thin-film element 501 used in the example shown in FIG. 22 or 23 will be described. The piezoelectric element (see FIGS. 3 and 17) described in detail in the first embodiment may be used.

In the piezoelectric thin-film element 510 shown in FIG. 24, a contact layer 512, a first electrode layer 513 as the lower electrode, a piezoelectric thin layer 514, and a second electrode layer 515 as the upper electrode are sequentially formed on a substrate 511.

The substrate 511 is, for example, a disc-like substrate with a thickness of 0.3 mm and a diameter of 4 inches. Here, a silicon substrate is used, but a glass substrate, a metal substrate, or a ceramic substrate may be used similarly.

The thickness of the contact layer 512 is 0.02 µm in the second embodiment, but may be in the range of 0.005 µm to 1 µm. The contact layer 512 is formed of titanium (Ti) in the second embodiment, may be formed of tantalum, iron, cobalt, nickel, or chromium, or compounds thereof in addition. The contact layer 512 serves to enhance the close contact property between the substrate 511 and the first electrode layer 513 and thus need not be provided when the close contact property between the substrate 511 and the first electrode layer 513 is excellent.

The thickness of the first electrode layer 513 is 0.22 μm in the second embodiment, but may be in the range of 0.05 to 2 μm. The conductive material used in the first electrode layer 513 is here platinum (Pt), but may be at least one rare metal or compounds thereof selected from a group consisting of Pt, iridium, palladium, and ruthenium.

The thickness of the second electrode layer 515 is 0.2 μm in the second embodiment, but may be in the range of 0.1 μm to 0.4 μm. The conductive material used in the second electrode layer 515 is here platinum (Pt), but may any conductive material.

The piezoelectric thin layer 514 is formed of PZT having a perovskite-type crystal structure of a rhombohedral system or a tetragonal system. The thickness is 3.5 μm in the second embodiment, but may be in the range of 0.5 μm to 10.0 μm. The constituent material thereof is a piezoelectric material containing PZT as a major component, as containing additives such as La, Sr, Nb, Al, and the like in addition to the PZT PMN or PZN does not matter.

The composition (Zr/Ti) of the PZT of the piezoelectric thin layer 514 is set to the composition (Zr/Ti=53/47) in the vicinity of the boundary (morphotoropic phase boundary) between the tetragonal system and the rhombohedral system, but may be in the range of Zr/Ti=30/70 to 70/30.

The piezoelectric thin layer 514 has a laminated structure of plural layers having different Pb compositions from the stoichiometric composition. In the example shown in FIG. 24, The piezoelectric thin layer 514 includes a two-layered structure of a layer 514a having a Pb composition greater than the stoichiometric composition and a layer 514b having a Pb composition smaller than the stoichiometric composition. In FIG. 24, the layer 514a having a Pb composition greater than the stoichiometric composition is first formed and then the layer 514b having a Pb composition smaller than the stoichiometric composition is formed thereon. However, the sequence of lamination and the number of layers to be laminated are not limited.

In the example shown in FIG. 24, the layer 514a having a Pb composition greater than the stoichiometric composition has a Pb composition of 10 mol % excess and a thickness of 3.0 μm. The layer 514b having a Pb composition smaller than the stoichiometric composition has a Pb composition of 2 mol % lack and a thickness of 0.5 μm. The excess of Pb in the layer 514a having a Pb composition greater than the stoichiometric composition is 25 mol % or less and preferably 15 mol % or less. The lack of Pb in the layer 514b having a Pb composition smaller than the stoichiometric composition is 10 mol % or less and preferably 5 mol % or less.

The layer 514a having a Pb composition greater than the stoichiometric composition and the layer 514b having a Pb composition smaller than the stoichiometric composition are formed so that they are both first oriented in any one face of face (111) and face (001). The layers have a column-shaped crystal structure, but the column-shaped particle diameter is greater in the layer 514a having a Pb composition greater than the stoichiometric composition than in the layer 514b having a Pb composition smaller than the stoichiometric composition. Here, the column-shaped particle diameter in the layer 514a having a Pb composition greater than the stoichiometric composition is 0.4 μm, while the column-shaped particle diameter in the layer 514b having a Pb composition smaller than the stoichiometric composition is 0.2 μm.

The orientation ratio of each phase is higher in the layer 514a having a Pb composition greater than the stoichiometric composition than in the layer 514b having a Pb composition smaller than the stoichiometric composition. It is numerically preferable that the orientation ratio in the layer 514a having a Pb composition greater than the stoichiometric composition is 70% or more and the orientation ratio in the layer 514b having a Pb composition smaller than the stoichiometric composition is 50% or more.

The piezoelectric thin layer 514 according to the second embodiment is first oriented in face (111). The orientation ratio is different between the layer 514a having a Pb composition greater than the stoichiometric composition and the layer 514b having a Pb composition smaller than the stoichiometric composition. The orientation ratio in (111) is 99% in the layer 514a having a Pb composition greater than the stoichiometric composition and 70% in the layer 514b having a Pb composition smaller than the stoichiometric composition.

When it is assumed that the orientation ratio in face (111) is indicated by $\alpha(111)$ and the orientation ratio in face (001) is indicated by $\alpha(001)$, $\alpha(111)=I(111)/\Sigma I(hkl)$ is defined. $\Sigma I(hkl)$ is the sum of diffraction peak intensities from the crystal faces in the PZT having a perovskite-type crystal structure when $2\theta$ at the time of using Cu—K$\alpha$ ray in the X-ray diffraction method is in the range of 10° to 70°.

In this way, since the piezoelectric thin layer 514 includes of column-shaped crystals in which crystal grains grow continuously in a column shape from an end to the other end in the thickness direction, the piezoelectric thin layer exhibits an excellent piezoelectric characteristic, and can obtain such a characteristic that the moisture is hardly diffused in the in-plane direction in the low-humidity environment and the region of dielectric breakdown is not spread. Since the grain boundary grows from the surface of one electrode layer (first electrode layer 513) toward the other electrode layer (second electrode layer 515) perpendicularly to the surface, it is excellent in crystal orientation and thus it is possible to obtain a more excellent piezoelectric characteristic.

Since the piezoelectric thin layer 514 contains Pb, Ti, and Zr, it is possible to construct a composition exhibiting an excellent piezoelectric characteristic. The Pb composition is distributed in different values in the thickness direction due to a difference in moisture diffusion in addition to the configuration or the crystal orientation of the column-shaped crystals. Accordingly, it is possible to delay or prevent the generation of the leak path reacting with Pb due to the permeation of moisture through a defective portion and to secure the longer-term reliability than the configuration in which the Pb composition is constant in the thickness direction. Since the composition of Zr and Ti is distributed in different values in the thickness direction, it is possible to delay or prevent the permeation and diffusion of moisture and to secure the long-term reliability due to the shame operational advantage. Since the piezoelectric thin-film layer 514 is generally several μm, the composition or element configuration hardly vary under the high-humidity environment, but the diffusion of moisture varies under the low-humidity environment. Accordingly, the piezoelectric thin film having such a configuration is preferably used.

Next, a method of manufacturing the piezoelectric thin-film element 510 having the above-mentioned structure will be described. Examples of the forming method of the piezoelectric thin-film element 510 include vapor deposition methods a sputtering method, a vacuum deposition method, a laser ablation method, an ion plating method, an MBE method, a PVD method, an MOCVD method, and a plasma CVD method. In the second embodiment, the contact layer 512, the first electrode layer 513, the piezoelectric thin layer 514, and the second electrode layer 515 are sequentially formed on the substrate 511 made of silicon by the use of the sputtering method.

The contact layer 512 is formed with a thickness of 0.02 μm by using a Ti target and applying RF power of 100 W for 1 minute while heating the substrate 511 at 400° C. in the argon gas with a degree of vacuum of 1 Pa.

The first electrode layer 513 is formed with a thickness of 0.22 μm by using a Pt target and applying RF power of 200 W for 12 minute while heating the substrate 511 at 400° C. in the argon gas with a degree of vacuum of 1 Pa. The second electrode layer 515 is formed with a thickness of 0.2 μm by using a Pt target and applying RF power of 200 W for 10 minute while keeping the substrate 511 at the room temperature in the argon gas with a degree of vacuum of 1 Pa.

The piezoelectric thin layer 514 with a thickness of 3.5 μm, which is disposed between the first electrode layer 513 and the second electrode layer 515, is manufactured by the use of a multiple sputtering apparatus. A sintered target of PZT (Zr/Ti=53/47, Pb excess of 20 mol %) is used for the layer 514a having a Pb composition greater than the stoichiometric composition and a sintered target PZT (Zr/Ti=53/47, Pb excess of 5 mol %) is used for the layer 514b having a Pb composition smaller than the stoichiometric composition.

In the configuration shown in FIG. 24, the layer 514a having a Pb composition greater than the stoichiometric composition is first formed and then the layer 514b having a Pb composition smaller than the stoichiometric composition is formed thereon. First, the layer 514a having a Pb composition greater than the stoichiometric composition is formed by applying RF power of 250 W for 170 minutes while heating the substrate 511 at 580° C. in the mixture atmosphere (gas volume ratio $Ar:O_2=15:5$) of argon and oxygen with a degree of vacuum of 0.3 Pa. Next, the layer 514b having a Pb composition smaller than the stoichiometric composition is formed by applying RF power of 200 W for 45 minutes while heating the substrate 511 at 650° C. in the mixture atmosphere (gas volume ratio $Ar:O_2=18:2$) of argon and oxygen with a degree of vacuum of 0.3 Pa.

Then, before forming the second electrode layer 515, the piezoelectric thin layer 514 manufactured under the above-mentioned sputtering condition was observed variously. First, regarding the Pb composition checked by the use of the X-ray micro analyzer, Pb is in excess of 10 mol % in the layer 514a having a Pb composition greater than the stoichiometric composition and the Pb is lack of 2 mol % in the layer 514b having a Pb composition smaller than the stoichiometric composition.

As the observation result with a SEM, the layer 514a having a Pb composition greater than the stoichiometric composition and the layer 514b having a Pb composition smaller than the stoichiometric composition both have the column-shaped structure. The column-shaped particle diameter in the layer 514a having a Pb composition greater than the stoichiometric composition is 0.4 μm and the column-shaped particle diameter in the layer 514b having a Pb composition smaller than the stoichiometric composition is 0.2 μm. The thickness of the layer 514a having a Pb composition greater than the stoichiometric composition is 3.0 μm and the thickness of the layer 514b having a Pb composition smaller than the stoichiometric composition is 0.5 μm. Accordingly, the total thickness of the piezoelectric thin layer 514 is 3.5 μm.

The crystal structure, the crystal orientation, and the inner stress of the piezoelectric thin layer 514 are examined by the use of an X-ray diffraction and $sin^2 \phi$ method. As a result, the piezoelectric thin layer 514 has a perovskite-type crystal structure of a rhombohedral system and is oriented in face (111). Regarding the (111) crystal orientation, the (111) orientation ratio is 99% in the layer 514a having a Pb composition greater than the stoichiometric composition and the (111) orientation ratio is 70% in the layer 514b having a Pb composition smaller than the stoichiometric composition.

(A) Driving Reliability Test for Determining Proper Dew Point Range

In the piezoelectric thin-film element manufactured as described above, the piezoelectric thin layer 514 is mechanically deformed by applying a voltage across the first electrode layer 513 and the second electrode layer 515. By manufacturing test samples having the following structures and testing the driving reliability, the proper dew point range was determined.

First, a resist was applied and patterned on the second electrode layer 515 and the electrode was etched by the use of a dry etching apparatus, whereby elements with a size of 0.1 mm×1.2 mm are uniformly arranged on a substrate. Thereafter, the resist pattern was removed, the resultant structure is cut and divided by a dicing process using 400 elements as 1 substrate, and the substrates were used as the test samples.

That is, in the respective substrates, the first electrode layer 513 was drawn out as a common electrode and the second electrode layer 515 was drawn out as an individual electrode. One substrate (400 elements) was put into a test bath in which the dew point environment can be controlled, and the driving voltage of DC 35V were simultaneously applied to the 400 elements for 500 hours. Thereafter, the appearance inspection of the elements (see FIG. 25), the measurement of leak current (see FIG. 26), and the SEM inspection (see FIG. 27) were performed, thereby testing the driving reliability. These were performed on 10 substrates (4000 elements).

The test bath has the configuration shown in FIG. 22. That is, a dry gas in which a dry air generated from a drier and the usual compressed air are mixed is introduced from the introduction port 504 and is discharged from the discharge port 505 while keeping the inner pressure of the test bath high.

The super drier unit SU3015B7 made by CKD Corporation was used as the air drier (dry air generator). The dry air generator includes an air filter for removing dust in the air, an oil mist filter for removing an oil component in the air, a drier body for removing moisture in the air, and a regulator for adjusting the pressure.

The drier body is formed of plural hollow fibers made of specific resin and has a structure that the compressed air passes through the hollow fibers. The resin constituting the hollow fibers has a feature of selectively transmitting only moisture to the outside of the hollow fibers. By allowing air containing water to pass through the hollow fibers, the moisture in the air is removed.

The control of the dew point environment was performed by adjusting the mixture ratio or the flow rate of the dray air and the compressed air on the introduction side (the introduction port 504 in FIG. 22) and the flow rate on the discharge side (the discharge port 505 in FIG. 22). The driving test was started when the dew point environment is stable for 1 hour or more after it gets constant. During the driving test, the dew point was made to be constant by minutely adjusting the flow rate.

Figure 25:
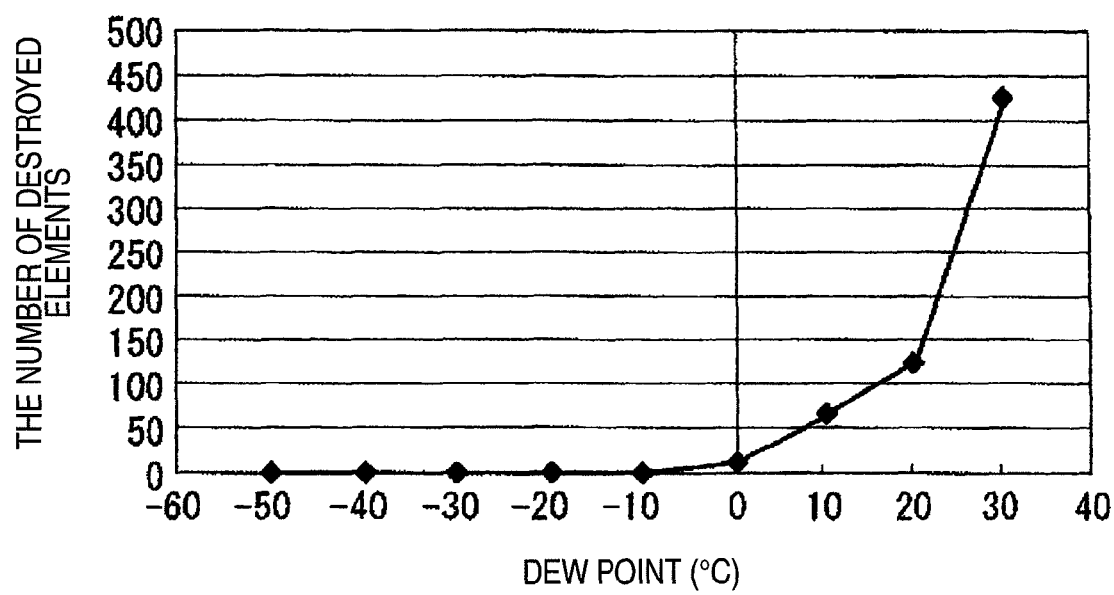
FIG. 25 is a graph illustrating a relation between a dew point and the number of destroyed piezoelectric thin-film elements with respect to the piezoelectric thin-film element according to the second embodiment of the invention.

FIG. 25 is a graph illustrating a relation between the dew point and the number of destroyed piezoelectric thin-film elements with respect to the piezoelectric thin-film element according to the second embodiment of the invention.

In FIG. 25, the horizontal axis represents a dew point [° C.] and the vertical axis represents the number of destroyed elements [piece].

As shown in FIG. 25, the test was performed while varying the dew point in the range of −50° C. to +30° C. In FIG. 25, the element destruction did not occur in the dew point of −50° C. to 0° C., but the element destruction was rapidly increased when it is more than zero.

Figure 26:
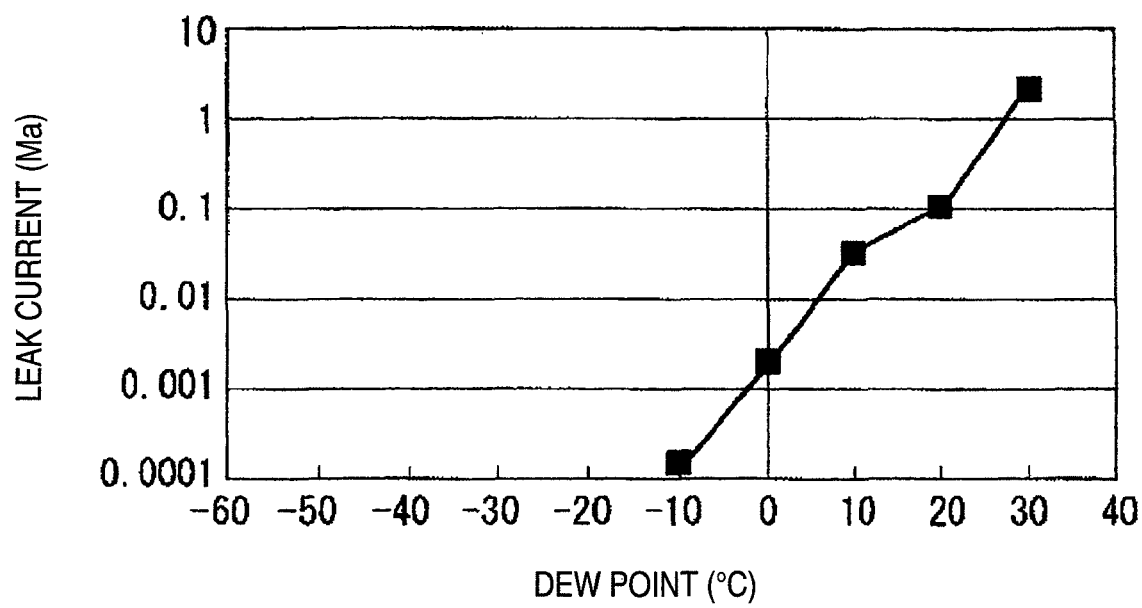
FIG. 26 is a graph illustrating a relation between a dew-point environment and one-element average leak current with respect to the piezoelectric thin-film element according to the second embodiment of the invention.

FIG. 26 is a graph illustrating a relation between the dew-point environment and the one-element average leak current with respect to the piezoelectric thin-film element according to the second embodiment of the invention.

In FIG. 26, the horizontal axis represents a dew point [° C.] and the vertical axis represents the average leak current [mA] of one element having the dielectric breakdown generated therein.

As shown in FIG. 26, the average leak current of one element having the dielectric breakdown was several μA when the dew point is 0° C. and the average leak current is irregular when the dew point is more than 0° C. Accordingly, plural elements having average leak current of several 10 μA that causes a problem in practice appear.

Figure 27A:
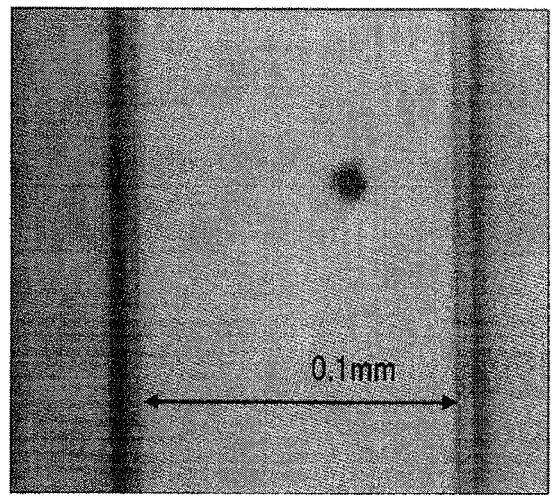
FIGS. 27(a), 27(b), and 27(c) are SEM photographs showing a relation between a dew point and a degree of element destruction with respect to the piezoelectric thin-film element according to the second embodiment of the invention.
Figure 27B:
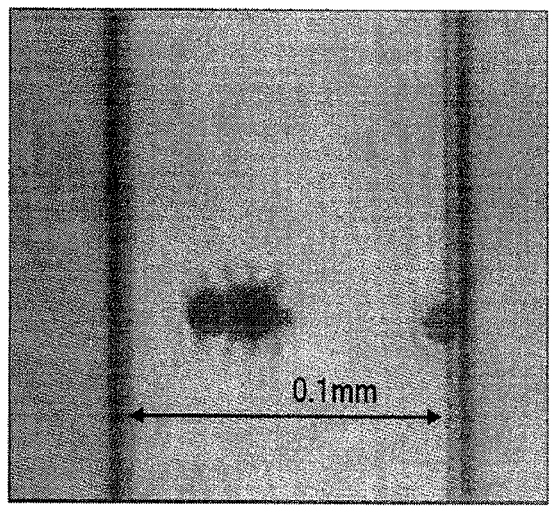
Figure 27C:
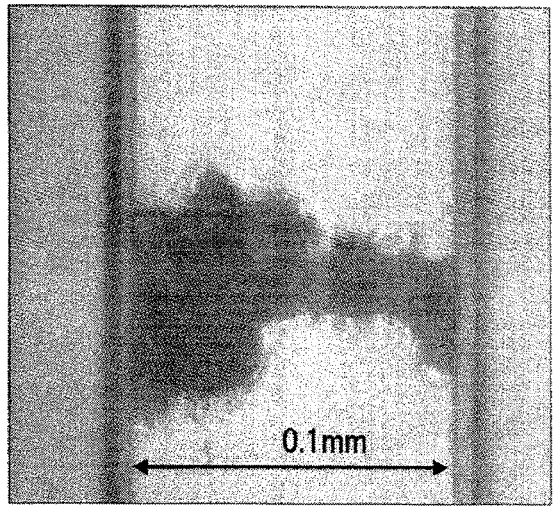

FIGS. 27(a), 27(b), and 27(c) are SEM photographs showing a relation between the dew point and the degree of element destruction with respect to the piezoelectric thin-film element according to the second embodiment of the invention.

FIG. 27(a) shows the element destruction state (degree) when the dew point is 0° C., FIG. 27(b) shows the element destruction state (degree) when the dew point is 10° C., and FIG. 27(c) shows the element destruction state (degree) when the dew point is 30° C.

In (a) the case where the dew point is 0° C., a part is destroyed in dielectric (black point) but the dielectric destruction does not go ahead any more. In (b) the case where the dew point is 10° C., the dielectric destruction goes ahead partially and many black points exist. In (c) the case where the dew point is 30° C., the black points grow greatly to cross the element.

It can be seen from the test result that when the dew point is lower than 0° C. and the dielectric breakdown occurs, the moisture for accelerating the destruction is not supplied and thus the element can be used in practice. However, when the dew point is higher than 0° C., the dielectric breakdown goes ahead due to the enlargement of the leak path resulting from the moisture to reach the crossing destruction of the element.

Accordingly, it could be seen that the dew point is lower than 0° C. and the humidity is low. However, it increases the cost very much that the very low-humidity environment, for example, the low-humidity environment lower than −40° C., is maintained.

When the dew point of −50° C. is embodied in the test, a high-performance dry air generator is used for the introduction side (the introduction port 504 in FIG. 22) and the compressed air is not mixed into the dry air. However, when the performance of the dry air generator is low, the dew point control is difficult. On the contrary, when the dew point is about −40° C., it is in the range that can be sufficiently controlled by the dry nitrogen introduced from the dew point controller, thereby suppressing the cost to be low. Since the dew point of −40° C. provides the results like the dew point of −50° C., the dew point to be controlled is preferably from −40° C. to 0° C. From this point of view, the dew point range of −40° C. to +0° C. was employed in the configuration shown in FIG. 22 or 23 according to the second embodiment.

(B) Driving Reliability Test on Whether Aging Process is Performed Before Driving Test samples, that is, 10 substrates having 400 elements, were manufactured in the same specification as the test samples used in Test (A). In each substrate, the first electrode layer 513 was drawn out as a common electrode and the second electrode layer 515 (see FIG. 24) was drawn out as an individual electrode to which a voltage is applied individually. It is assumed that the dew point at the time of driving the 10 substrates (4000 elements) is 0° C. The samples were driven in a state where the dew point is −40° C. (aging process) before driving and is 0° C. at the time of driving. The appearance inspection and the leak current measurement for the respective elements were performed and thus the driving reliability was estimated on whether the aging process is performed.

That is, in Test (B), the piezoelectric thin-film element 510 was subjected to the aging process at the dew point of −40° C. under the following condition and the driving test was performed at the dew point 0° C.

First, one substrate (400 elements) was put into a test bath maintained at the dew point of −40° C. and the driving voltage of DC 40 V was simultaneously applied to the 400 elements for 1 hour, thereby performing the aging process. Thereafter, the dew point of the test bath was changed to 0° C. and left for 1 hour for stabilization. Then, the driving voltage of DC 35V was simultaneously applied to the 400 elements to drive the elements continuously for 500 hours. This process was performed on the 10 substrates (4000 elements).

As the result of the appearance inspection of the elements, the number of destroyed elements was 8, which was not much different from 10 elements when the aging process was not performed, that is when the dew point is 0° C. in Test (A). However, in the measurement result of the leak current, the one-element average leak current of the elements having subjected to the aging process was 0.24 μA, which was lower by almost 1 digit than the average value 2.1 μA when the aging process is not performed.

When the aging process of applying an aging voltage (DC 40 V as described above in the second embodiment) higher than that at the time of driving at the dew point (in the range of dew point of −40° C. to 0° C.) lower than that at the time of driving, minute weak portions existing in the piezoelectric thin-film element are destroyed. Accordingly, the number of leak paths generated at the time of driving at a high humidity can be reduced.

In this way, by performing the aging process in advance at the dew point lower than that at the time of actually driving, the increase in leak current can be suppressed at the time of actually driving the element, which is at a high dew point, thereby stably driving the piezoelectric thin-film elements. The aging voltage may be an AC voltage but it is preferable that the aging voltage is a DC voltage from the viewpoint for preventing the piezoelectric thin-film element from being destroyed due to the mechanical vibration.

(C) Another Example of Driving Reliability Test of Element Under Low-Humidity Environment.

It is described here that a test having the same details as Test (A) is performed every element. First, in order to maintain the atmosphere in the vicinity of the element at a low dew point, the element sealing using a sealing member for intersecting the element from the external humidity environment was performed as follows.

That is, the respective elements were wired to be driven and were put into the environment for maintaining the humidity low, such as a glove box, and then the moisture absorbed onto the surface was removed. The dry air or the dry nitrogen was introduced into the glove box, so that the dew point is −40° C. By putting the glass substrate as a sealing member, an adhesive, and a drying agent into the glove box in advance, the absorbed moisture was removed similarly. The sealing member includes two members. One is a plate-like glass substrate, which serves as a base. The other is a sealing cap obtained by etching a glass substrate concave in an area greater than the driving area of the element.

The drying agent is received in the concave portion of the sealing cap and sealed, and then a space enough not to come in contact with the piezoelectric thin-film element is secured. One obtained by processing synthetic zeolite (molecular sieve) made by UNION SHOWA K.K into a sheet shape is used as the drying agent and is attached to the concave portion of the sealing cap.

Next, the piezoelectric thin-film element is fixed onto the base, an adhesive is applied to the region to be attached to the base of the sealing cap, wires are drawn out, and then the bases are bonded. After the bonding, the adhesive is hardened while a weight is applied thereto to come in close contact so as not to generate bubbles in the adhesive. As the adhesive, a UV-curable and thermosetting type such as 8722V5 made by Kyoritu Chemical & CO., Ltd. was used.

The piezoelectric thin-film element was irradiated by a UV lamp in the glove box for a predetermined time and then was taken out of the glove box. The UV was irradiated with 300 mW/cm$^2$ for 20 seconds. After being taken out, the piezoelectric thin-film element was subjected to heat treatment using an oven at 80° C. and for 1 hour. Thereafter, by applying a predetermined voltage across both electrodes of the piezoelectric thin-film element, the sealing leak was checked. When the leak path does not exist, the driving of the piezoelectric thin-film element was started and the test having the same details as Test (A) was performed.

In the above-mentioned sealing method, the base was prepared independently of the piezoelectric thin-film element, but the substrate base of the piezoelectric thin-film element may be used. Even by applying an adhesive to a margin in the outer periphery of the driven element and attaching the sealing cap thereto, similar effects can be obtained.

Figure 28:
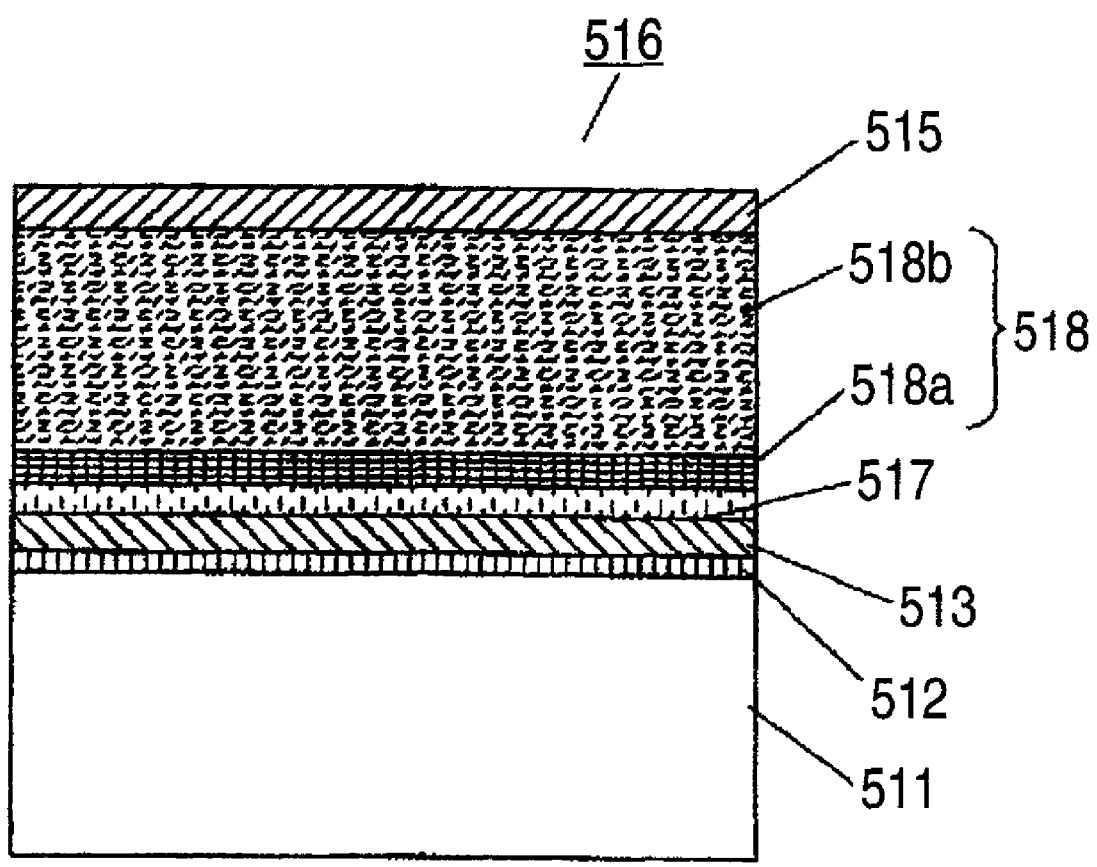
FIG. 28 is a sectional view illustrating another configuration of the piezoelectric thin-film element according to the second embodiment of the invention.

FIG. 28 is a sectional view illustrating another configuration of the piezoelectric thin-film element according to the second embodiment of the invention.

As shown in FIG. 28, in the piezoelectric thin-film element 516, a buffer layer 517 having low permittivity is disposed between the first electrode layer 513 and the piezoelectric thin layer 514 in the configuration shown in FIG. 24. A piezoelectric thin layer 518 that has a two-layered structure different in configuration is disposed instead of the piezoelectric thin layer 514.

The buffer layer 517 has a function of promoting the crystal growth of the piezoelectric thin layer 518 and a function of reducing the stress generated in the piezoelectric thin layer 518 at the time of applying a voltage to prevent the cracks from occurring after forming the layers. The generation speed of the leak path is decreased due the latter function, thereby securing the long-term driving reliability.

The buffer layer 517 is formed of PLT in which an A site of lead titanate (PT) having a perovskite structure is replaced with La by 10%. As the measurement result of a thick layer with a thickness of 0.2 μm, the buffer layer 517 formed of PLT was first oriented in face (001) and had specific permittivity of 450. The buffer layer 517 may be formed of another material not preventing the crystal growth of the piezoelectric thin layer 518.

Similarly to the configuration shown in FIG. 24, the piezoelectric thin layer 518 is formed of PZT having a perovskite-type crystal structure of a rhombohedral system or a tetragonal system with a film thickness of 3.5 μm. The layer 518a having a Pb composition greater than the stoichiometric composition and being close to the buffer layer 517 has a thickness of 0.3 μm and a composition of Zr/Ti=70/30. The layer 518b having a Pb composition greater than the stoichiometric composition and being close to the second electrode layer 515 has a thickness of 3.2 μm and a composition of Zr/Ti=53/47. The layers 518a and 518b having a Pb composition greater than the stoichiometric composition are both in excess of 10 mol % when the Pb composition is compared with the stoichiometric composition. The measured specific permittivity of the piezoelectric thin layer 518 was 950.

It is preferable that the Zr composition ratio in the piezoelectric thin layer 518 is greater in the layer close to the buffer layer 517. However, since the buffer layer 517 is exists, the small Zr composition ratio does not influence the orientation and the like. Accordingly, a multi-layered structure or a structure in which the Zr composition gradually varies in the thickness direction may be employed. In order to enhance the insulating property, PLT used for the buffer layer 517 may be formed close to the second electrode layer 515 of the piezoelectric thin layer 518. Another material having low specific permittivity may be used for the piezoelectric thin layer 518.

The above-mentioned driving reliability test and the test on whether the aging process is performed were carried out on the piezoelectric thin-film element having the above-mentioned configuration. In this case, the same results could be obtained.

A configuration of an ink jet head employing the piezoelectric thin-film element according to the second embodiment will be described now.

Figure 29:
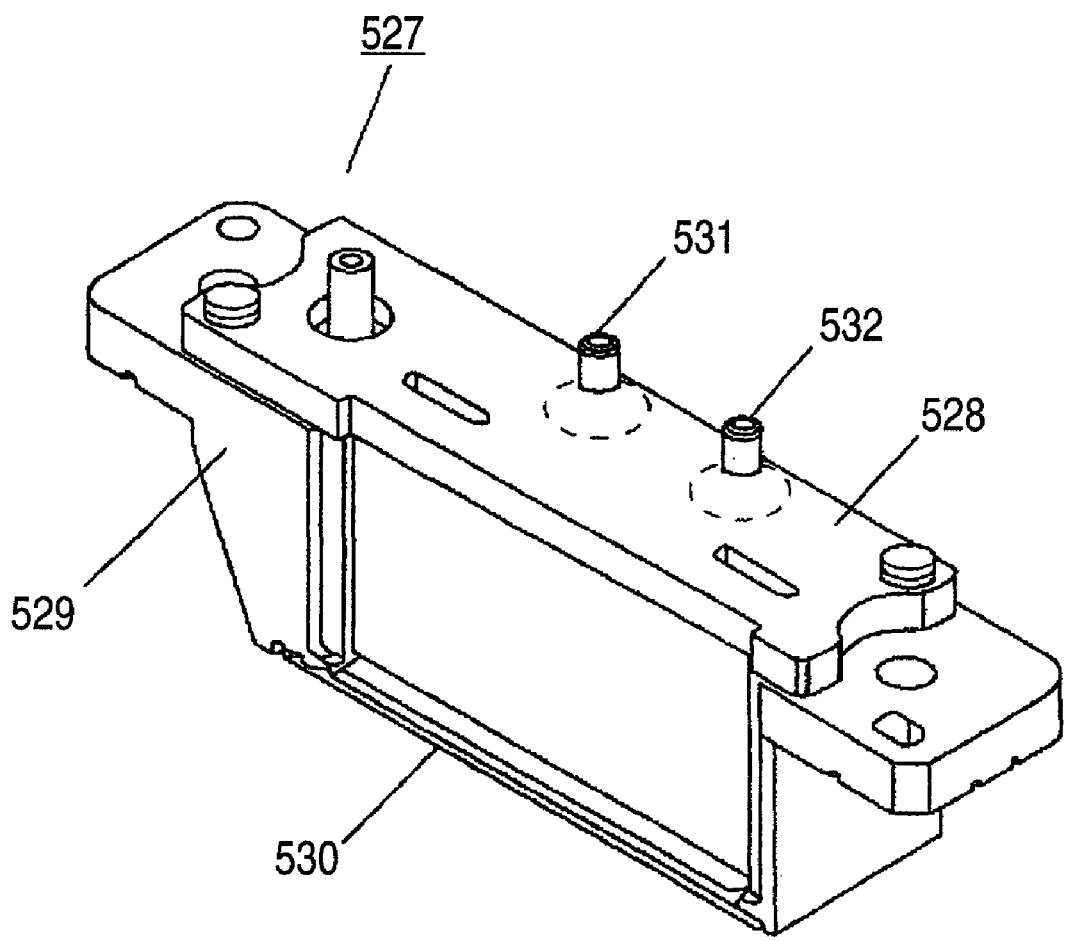
FIG. 29 is a perspective view illustrating a configuration of an ink jet head mounted with the piezoelectric thin-film element according to the second embodiment of the invention.

FIG. 29 is a perspective view illustrating a configuration of the ink jet head mounted with the piezoelectric thin-film element according to the second embodiment of the invention.

A configuration of providing a low-humidity environment to the piezoelectric thin-film element mounted on the ink jet head will be described with reference to FIG. 29.

In FIG. 29, an ink jet head 527 has a configuration in which an ink jet head body 530 is attached to a head base 529 mounted with the head cover 528. The head cover 528 includes an introduction port 531 and the discharge portion 532.

According to this configuration, by attaching the head cover 518 to the head base 519 to which the ink jet head body 530 has been attached, supplying a dry air from the dew point controller 503 (see FIG. 22) described above, such as a dry air generator or a pipe for a dry gas (nitrogen gas, argon gas, and the like) in a plant, to the introduction port 531, and then discharging the dry gas from the discharge port 532, it is possible to control the dew point environment in the vicinity of the piezoelectric thin-film element of the ink jet head body 530 to be constant.

Next, a configuration of the ink jet head body 530 will be described. Briefly speaking, the ink jet head (body) 530 includes a vibrating plate disposed on a surface of any one electrode layer side of both electrode layers in the piezoelectric thin-film element described in the first embodiment or the second embodiment and a pressure chamber member that is disposed on the surface of the vibrating plate opposite to the piezoelectric thin-film element and that has a pressure chamber for containing ink. The ink in the pressure chamber is ejected by deforming the vibrating plate in the film thickness direction by the use of the piezoelectric effect of the piezoelectric thin-film element.

As described in detail above, the piezoelectric thin-film element according to the second embodiment includes a piezoelectric thin film with a predetermined thickness, electrodes formed on both surfaces of the piezoelectric thin film in the thickness direction, and a dew point controller for keeping the dew point of the atmosphere around the piezoelectric thin-film element in the range of −40° C. to 0° C.

The piezoelectric thin film of the piezoelectric thin-film element according to the second embodiment includes column-shaped crystals in which crystal grains grow in a column shape from an end to the other end in the film thickness direction.

In the piezoelectric thin film of the piezoelectric thin-film element according to the second embodiment, the grain boundary of the piezoelectric thin film grows from one electrode to the electrode in a direction substantially perpendicular to the one electrode.

The piezoelectric thin film of the piezoelectric thin-film element according to the second embodiment contains Pb, Ti, and Zr.

In the piezoelectric thin film of the piezoelectric thin-film element according to the second embodiment, the Pb composition ratio is distributed in various values in the film thickness direction.

In the piezoelectric thin film of the piezoelectric thin-film element according to the second embodiment, the composition ratio of Zr and Ti is distributed in various values in the film thickness direction.

In the piezoelectric thin film of the piezoelectric thin-film element according to the second embodiment, a low-permittivity layer is formed at least at one end in the film thickness direction.

The piezoelectric thin film of the piezoelectric thin-film element according to the second embodiment is formed by the use of a vapor deposition method such as a sputtering method, a vacuum deposition method, a laser ablation method, an ion plating method, an MBE method, and a plasma CVD method.

In the piezoelectric thin-film element according to the second embodiment, the dew point controller for keeping the dew point around the piezoelectric thin-film element in the range of −40° C. to 0° C. supplies a dry gas to the atmosphere around the piezoelectric thin-film element.

In the piezoelectric thin-film element according to the second embodiment, the dew point controller for keeping the dew point around the piezoelectric thin-film element in the range of −40° C. to 0° C. includes an introduction port and a discharge port and continuously supplies a dry gas of which the dew point is in the range of −40° C. to 0° C. to a case having a space for not preventing the vibration around the piezoelectric thin-film element and the introduction port, thereby controlling the gas pressure in the case to be higher than the external pressure.

In the piezoelectric thin-film element according to the second embodiment, the dew point controller for keeping the dew point around the piezoelectric thin-film element in the range of −40° C. to 0° C. includes a sealing member for forming around the piezoelectric thin-film element an airtight space having a size not to prevent the vibration of the piezoelectric thin-film element and serving to prevent permeation of moisture from the outside, and a drying agent for keeping the dew point around the piezoelectric thin-film element in the range of −40° C. to 0° C.

In the method of aging the piezoelectric thin-film element according to the second embodiment, an aging voltage higher than a driving voltage is applied at a dew point lower than the dew point at the time of driving the piezoelectric thin-film element, before driving the piezoelectric thin-film element.

It is preferable that the aging voltage is a DC voltage.

In the environment at the time of performing the aging process, the dew point is in the range of −40° C. to 0° C.

An ink jet head employing the piezoelectric thin-film element according to the second embodiment includes a piezoelectric thin-film element, a vibrating plate that is disposed on a surface of one electrode layer in the piezoelectric thin-film element, a pressure chamber that is disposed on the surface of the vibration plate opposite to the piezoelectric thin-film element and that ejects ink depending on the deformation in the thickness direction of the vibrating plate due to the piezoelectric effect of the piezoelectric thin-film element, and a dew point controller that keeps the dew point around the piezoelectric thin-film element in the range of −40° C. to 0° C.

An ink jet recording device employing a piezoelectric thin-film element according to the second embodiment includes the above-mentioned ink jet head and relative moving means for relatively moving the ink jet head and the recording medium, wherein while the ink jet head is being moved relative to the recording medium by the relative moving means, ink in the pressure chamber is ejected onto the recording medium from a nozzle orifice disposed to communicate with the pressure chamber in the ink jet head to perform a recording operation.

As described above, the piezoelectric element according to the invention is excellent in printing ability and durability and is useful for an ink jet head and an ink jet recording device.

The piezoelectric element can be suitably used for a thin film capacitor, a charge accumulating capacitor of a nonvolatile memory device, various actuators, an infrared sensor, an ultrasonic sensor, a pressure sensor, an angular velocity sensor, an acceleration sensor, a flow sensor, a shock sensor, a piezoelectric transformer, a piezo ignition device, a piezoelectric speaker, a piezoelectric microphone, a piezoelectric filter, a piezoelectric pickup, a tuning-fork oscillator, and a delay line, in addition to the ink jet head.

Specifically, the piezoelectric element can be suitably used for a disc thin-film piezoelectric actuator (for example, JP-A-2001-332041) for deforming a substrate to displace a recording and reproducing head by the use of a thin-film piezoelectric element disposed on the substrate in a head supporting mechanism in which the recording and reproducing head for recording and reproducing information on and from a disc of a disc device (which is used as a memory unit of a computer) is disposed on the substrate.

This application is based upon and claims the benefit of priority of Japanese Patent Application No 2007-018911 filed on Jan. 30, 2007 and Japanese Patent Application No 2007-045076 filed on Feb. 26, 2007, the contents of which is incorporated herein by references in its entirety.

What is claimed is:

1. A piezoelectric element, comprising:
    a pressure chamber member including an opening communicating with a nozzle;
    a vibrating plate disposed on the pressure chamber member so as to cover the opening;
    a lower electrode disposed on the vibrating plate;
    a piezoelectric body disposed on the lower electrode;
    an upper electrode disposed on the piezoelectric body and in a region opposed to the opening; and
    a lead electrode disposed on the piezoelectric body, extended from the upper electrode and including a width smaller than that of the upper electrode,
    wherein the piezoelectric body includes:
        a groove portion disposed in a predetermined region along an edge portion of the opening; and
        an inactive region that is a region other than the groove portion, that is disposed along the edge portion of the opening, and that does not substantially serve as a piezoelectric element,
    wherein the lead electrode is disposed in the inactive region, and
    wherein a concave portion formed by removing the piezoelectric body is disposed on a side of the lead electrode extending from the upper electrode.

2. The piezoelectric element according to claim 1, wherein the groove portion and the concave portion are allowed to communicate with each other.

3. The piezoelectric element according to claim 1, wherein an anti-vibration portion is disposed between an end of the groove portion and the lead electrode extending from the upper electrode so as to extend over the edge portion of the opening.

4. The piezoelectric element according to claim 3, wherein the anti-vibration portion is formed of a material having Young's modulus higher than that of the piezoelectric body.

5. The piezoelectric element according to claim 3, wherein the anti-vibration portion is formed of the same material as the upper electrode.

6. The piezoelectric element according to claim 3, wherein the anti-vibration portion is formed of a metal or an inorganic material not transmitting moisture, or a dampproof material having a water-absorbing ratio of 0.1% or less.

7. The piezoelectric element according to claim 1, wherein a relation of W>2t is satisfied, where t is a thickness of the piezoelectric body and w is the shortest distance between the lead electrode disposed on the piezoelectric body and the groove portion.

8. The piezoelectric element according to claim 7, wherein a relation of $(2W+w) \geqq 3t$ is satisfied, where w is a width of the lead electrode extending over the edge portion.

9. A piezoelectric element, comprising:
a pressure chamber member including an opening communicating with a nozzle;
a vibrating plate disposed on the pressure chamber member so as to cover the opening;
a lower electrode disposed on the vibrating plate;
a piezoelectric body disposed on the lower electrode;
an upper electrode disposed on the piezoelectric body and in a region opposed to the opening; and
a lead electrode disposed on the piezoelectric body, extended from the upper electrode over an edge portion of the opening, and including a width smaller than that of the upper electrode,
wherein a groove portion is formed in a region of the piezoelectric body along the edge portion of the opening other than the vicinity of a region where the lead electrode extends over the edge portion of the opening,
wherein an end of the groove portion close to the lead electrode is formed in such a curved shape that a portion facing the lead electrode is convex, and
wherein an end of the groove portion facing the lead electrode is formed in a substantially circular shape with a diameter larger than the width of the groove portion.

10. A piezoelectric element, comprising:
a pressure chamber member including an opening communicating with a nozzle;
a vibrating plate disposed on the pressure chamber member so as to cover the opening;
a lower electrode disposed on the vibrating plate;
a piezoelectric body disposed on the lower electrode;
an upper electrode disposed on the piezoelectric body and in a region opposed to the opening; and
a lead electrode disposed on the piezoelectric body, extended from the upper electrode and including a width smaller than that of the upper electrode,
wherein the piezoelectric body includes:
a groove portion disposed in a predetermined region along an edge portion of the opening; and
an inactive region that is a region other than the groove portion, that is disposed along the edge portion of the opening, and that does not substantially serve as a piezoelectric element,
wherein the lead electrode is disposed in the inactive region, and
wherein an insulator layer is disposed outside the region opposed to the opening and between the upper electrode and the piezoelectric body or between the piezoelectric body and the lower electrode.

11. A piezoelectric element, comprising:
a pressure chamber member including an opening communicating with a nozzle;
a vibrating plate disposed on the pressure chamber member so as to cover the opening;
a lower electrode disposed on the vibrating plate;
a piezoelectric body disposed on the lower electrode;
an upper electrode disposed on the piezoelectric body and in a region opposed to the opening; and
a lead electrode disposed on the piezoelectric body, extended from the upper electrode and including a width smaller than that of the upper electrode,
wherein the piezoelectric body includes:
a groove portion disposed in a predetermined region along an edge portion of the opening; and
an inactive region that is a region other than the groove portion, that is disposed along the edge portion of the opening, and that does not substantially serve as a piezoelectric element,
wherein the lead electrode is disposed in the inactive region, and
wherein a relation of N>M is satisfied, where N is a horizontal distance from an end of the upper electrode to the edge portion of the opening in a direction in which the lead electrode extends and M is a horizontal distance from an end of the upper electrode to an end of the opening in a direction opposite to the direction in which the lead electrode extends.

12. A piezoelectric element, comprising:
a pressure chamber member including an opening communicating with a nozzle;
a vibrating plate disposed on the pressure chamber member so as to cover the opening;
a lower electrode disposed on the vibrating plate;
a piezoelectric body disposed on the lower electrode;
an upper electrode disposed on the piezoelectric body and in a region opposed to the opening; and
a lead electrode disposed on the piezoelectric body, extended from the upper electrode and including a width smaller than that of the upper electrode,
wherein the piezoelectric body includes:
a groove portion disposed in a predetermined region along an edge portion of the opening; and
an inactive region that is a region other than the groove portion, that is disposed along the edge portion of the opening, and that does not substantially serve as a piezoelectric element,
wherein the lead electrode is disposed in the inactive region,
wherein a surface-mounting pad portion is formed at the end of the lead electrode extending from the upper electrode, and
wherein a concave portion formed by removing the piezoelectric body is disposed on a side of the pad portion.

* * * * *